US007160572B2

(12) United States Patent
Fujikata et al.

(10) Patent No.: US 7,160,572 B2
(45) Date of Patent: Jan. 9, 2007

(54) SPIN TUNNEL MAGNETORESISTIVE EFFECT FILM AND ELEMENT, MAGNETORESISTIVE SENSOR USING SAME, MAGNETIC APPARATUS, AND METHOD FOR MANUFACTURING SAME

(75) Inventors: Junichi Fujikata, Tokyo (JP); Tsutomu Ishi, Tokyo (JP); Shigeru Mori, Tokyo (JP)

(73) Assignee: NEC Corporation, Tokyo (JP)

(*) Notice: Subject to any disclaimer, the term of this patent is extended or adjusted under 35 U.S.C. 154(b) by 57 days.

(21) Appl. No.: 10/923,990

(22) Filed: Aug. 23, 2004

(65) Prior Publication Data

US 2005/0019610 A1 Jan. 27, 2005

Related U.S. Application Data

(62) Division of application No. 10/033,669, filed on Dec. 28, 2001, now abandoned.

(30) Foreign Application Priority Data

Dec. 28, 2000 (JP) ............................ 2000-399868

(51) Int. Cl.
*B05D 5/12* (2006.01)

(52) U.S. Cl. ...................... 427/127; 427/128; 427/129; 427/130; 427/131; 428/692

(58) Field of Classification Search ........ 427/127–131; 428/692

See application file for complete search history.

(56) References Cited

U.S. PATENT DOCUMENTS

| | | | | |
|---|---|---|---|---|
| 5,629,922 | A * | 5/1997 | Moodera et al. | 369/126 |
| 6,335,081 | B1 * | 1/2002 | Araki et al. | 428/141 |
| 2002/0097534 | A1 * | 7/2002 | Sun et al. | 360/324.2 |

FOREIGN PATENT DOCUMENTS

| | | |
|---|---|---|
| JP | 2000-011333 | 1/2000 |
| JP | 2000-101164 | 4/2000 |
| JP | 2001-36165 | 2/2001 |
| JP | 2001-203408 | 7/2001 |

* cited by examiner

*Primary Examiner*—Alain L. Bashore
(74) *Attorney, Agent, or Firm*—Muirhead & Saturnelli, LLC

(57) ABSTRACT

In a spin tunnel magnetoresistive effect film in which a magnetic thin film to which an exchange bias is applied by exchange coupling via an anti-ferromagnetic thin film and a magnetic thin film that detects a magnetic field are laminated, a magnetic thin film or an anti-ferromagnetic thin film (PtMn, PdMn, NiMn) is laminated onto an underlayer (Ta, Zr, Hf), the surface roughness thereof being in the range from 0.1 to 5 Angstroms. A means used to control the surface roughness introduces into the film growing chamber oxygen, nitrogen, hydrogen, or a gas mixture thereof into a vacuum of $10^{-6}$ Torr to $10^{-9}$ Torr, reduces the substrate temperature to 0° C. or lower during film growth, or oxidizes an underlayer. The lower electrode layer material used is a film laminate of a high-permeability amorphous magnetic material and a non-magnetic metallic layer.

5 Claims, 12 Drawing Sheets

SPIN TUNNEL MAGNETORESISTIVE EFFECT FILM AND ELEMENT, MAGNETORESISTIVE SENSOR USING SAME, MAGNETIC APPARATUS, AND METHOD FOR MANUFACTURING SAME

CROSS REFERENCE TO RELATED APPLICATIONS

This application is a divisional of U.S. patent application Ser. No. 10/033,669 filed on Dec. 28, 2001 (now abandoned).

BACKGROUND OF THE INVENTION

1. Field of the Invention

The present invention relates to a spin tunnel magnetoresistive effect element for reading a magnetic field strength, which is information recorded on a magnetic medium or the like, as a signal, and to a spin tunnel magnetoresistive effect film used therein, and more particularly it relates to a spin tunnel magnetoresistive effect film, a spin tunnel magnetoresistive effect element, and a spin tunnel magnetoresistive effect sensor and magnetic apparatus using the element, that achieve a large output with a small external magnetic field.

2. Related Art

A ferromagnetic tunnel junction has a construction in which a tunnel barrier layer made of an insulation film having a thickness of several nanometers is sandwiched between two ferromagnetic layers. In this element, if a certain current caused to flow between the ferromagnetic layers and an external magnetic field is applied within the ferromagnetic plane, there appears magnetoresistive effect, in which the value of resistance changes in response to the relative angle of magnetization between the magnetic layers. If the magnetizations are parallel, the resistance value is minimum, and if the magnetization is anti-parallel, the resistance value varies in accordance with the angle thereof, and when the magnetization orientations are opposite, the resistance is maximum.

Therefore, if a coercivity difference is imparted to the magnetic layers, it is possible to establish parallelness or anti-parallelness of magnetizations responsive to the strength of an external magnetic field, making it possible to detect a magnetic field by the change of the resistance value. If the polarization of the two magnetic layers are P1 and P2, the resistance value change ratio, which establishes the magnetic field sensitivity, is expressed as $2\,P1\,P2/(1-P1\,P2)$. This equation means that the larger the polarizations are of both magnetic layers, the larger is the magnetoresistive change ratio. In recent years, with an improvement in the quality of tunnel barrier layers, it has become possible to achieve a ferromagnetic tunnel junction exhibiting a magnetoresistive change ratio close of 20%, which is close to the theoretical value, resulting in an increase in the possibility for application to magnetic heads and magnetic memories.

Typical reported examples of such large magnetoresistive change ratio are found in Journal of Applied Physics, Vol. 79, pp. 4724–4729 (1996) and Journal of Applied Physics, Vol. 81, pp. 3741–3746. In these reported examples, a 20-nm Pt electrode is laminated onto a silicon substrate, over which are formed a 4-nm NiFe layer, a 10-nm FeMn layer, a 8-nm NiFe layer, a 1-to-3-nm Al layer, after which oxygen plasma is used to form an Al oxide film, followed by subjecting the 8-nm NiFe layer to an exchange coupling magnetic field. In this element, a high magnetoresistive change ratio of 22% is achieved.

In Applied Physic Letters, Vol. 72, pp. 605–607 (1998), there is a report of a ferromagnetic tunnel junction element made of $Co/Al_2O_3/Co/NiO$ using NiO as an anti-ferromagnetic material and having magnetoresistive change ratio of 17% in a room temperature. In IEEE Transactions of Magnetics, Vol. 33, pp. 3553–3555 (1997), there is a report of a ferromagnetic tunnel junction element made of NiFe/Co/Al—$AlO_x$/Co/NiFe/FeMn/NiFe using FeMn as an anti-ferromagnetic material, in which a magnetoresistive change ratio of 24% is observed at room temperature, the magnetic hysteresis thereof being similar to that of a spin valve.

A method of fixing magnetization using an anti-ferromagnetic material such as noted above has been used in the past in a spin valve film, and these reported examples could be said to be applications of this method to a ferromagnetic tunnel junction.

The magnetic hysteresis in the element is similar to that of a spin valve film, and there is a reduction in hysteresis in the zero-field region. Compared to a coercivity difference type ferromagnetic tunnel junction, therefore, this configuration is suitable for application to devices such as magnetic sensors.

In order to apply a ferromagnetic tunnel junction element to a high-density magnetic recording head, it is desirable in this manner that one of the ferromagnetic materials have a spin-valve structure with exchange bias applied thereto. The anti-ferromagnetic material used therein not only must have thermal stability that does not hinder device operation, but also must have a high resistance to corrosion in the device fabrication process. In the above-noted reports, however, when low-blocking-temperature of FeMn (blocking temperature 150° C.) and NiO (blocking temperature 200° C.) are used, the thermal stability is insufficient.

The reason for this is that, if the blocking temperature is low, the temperature rise occurring when the element operates weakens the pinned magnetic field, so that as a result of environmental magnetic fields (such as a magnetic field by a sensor current or the like), there is a change in the pinned layer magnetization direction, resulting in a drop in magnetic field sensitivity therein. In the case of an anti-ferromagnetic material having a high blocking temperature, even if the temperature of the element rises, it is difficult for the magnetization direction of the pinned layer to change, which would cause a decrease in sensitivity. FeMn in particular has poor corrosion resistance, and there are remaining problems to be solved in the device fabrication process as well.

Mn regular alloys of PtMn, PdMn, and NiMn are anti-ferromagnetic materials having a high blocking temperature of 300° C. or greater. An anti-ferromagnetic material made of these Mn regular alloys has superior thermal stability due to its high blocking temperature, and also has good corrosion resistance, making this material extremely advantageous when a ferromagnetic tunnel junction element is applied to a device such as a magnetic head.

These materials, however, do not exhibit an exchange coupling magnetic field in the condition immediately after film formation. The reason for this is that, in the condition immediately after film formation, these materials are in a chaotic phase.

Therefore, in order to regularize the chaotic phase so that a proper exchange coupling magnetic field is achieved, it is necessary to perform thermal processing in a magnetic field for a long period of time at a higher temperature than in the past (250° C. for PtMn, 230° C. for PdMn, and 270° C. or higher for NiMn, for a period of approximately 5 hours).

In a spin tunnel magnetoresistive effect element in the above-noted literature, although operation is done with a small external magnetic field, in the case of using these in practical sensors and magnetic heads, there is the problem that the neel temperature of FeMn is low, leading to a problem of poor thermal stability in the device. If a substance such as PtMn, PdMn, or NiMn or the like, having a high neel temperature is used as an anti-ferromagnetic film, it is necessary to perform proper thermal processing in order to achieve an anti-ferromagnetic phase (regular phase), and this thermal processing causes problems such as diffusion of oxygen or nitrogen within the tunnel barrier layer, and a reduction of the resistance change ratio, that is, a reduction in the output when used as a device.

In a method of fabricating a spin tunnel magnetoresistive effect film of the past, the resistance of the spin tunnel element was 100 Ω, which is extremely high, and the influence of deterioration of the high-frequency response in the magnetoresistive detection system and the influence of shot noise impedes the achievement of a sufficient S/N ratio at high recording densities.

If the tunnel barrier layer is made thin, so as to reduce the resistance of the element in order to handle the above-noted problem, there is the problem that current leakage occurs because of the pinhole effect, thereby lowering the magnetoresistive change ratio.

While the disclosure of Japanese unexamined patent publication (KOKAI) No. 2000-215415 is known, although this publication has language with regard to a magnetoresistive effect element in which the surface roughness of the lower shield layer is made 3 nm or smaller, in this technology even if the surface roughness of the lower shield layer is made smaller than 3 nm, there is little substantial influence on the surface of the tunnel barrier, and it is not possible to achieve the intended magnetoresistive effect element.

Accordingly, it is an object of the present invention to provide a spin tunnel magnetoresistive effect film and spin tunnel magnetoresistive effect element magnetoresistive change ratio of which is not lowered even when the thickness of the tunnel barrier layer made thin and having superior high-frequency response and thermal stability, sufficiently low resistance for application to a magnetic head, and a high linear magnetic field sensitivity in the region about the zero field point.

SUMMARY OF THE INVENTION

In order to achieve the above-noted objects, the present invention adopts the following basic technical constitution.

The present invention relates to a configuration of a lower layer and laminate in which at least two magnetic thin films are laminated with a tunnel barrier layer intervening therebetween, an anti-ferromagnetic thin film being provided adjacent to one of the magnetic thin films (the first magnetic thin film) that are laminated via a tunnel barrier layer, and when a bias magnetic field in accordance with the anti-ferromagnetic thin film is Hr and a coercivity of the other magnetic thin film (second magnetic thin film) is Hc2, the relationship therebetween is $Hc2<Hr$ obtains.

The lower layer exhibits flatness in the spin tunnel magnetoresistive effect film and a clear boundary in the multilayer films, and it is desirable that this be Ta, Hf, Zr, or an alloy thereof. In the case in which Ta, Hf, Zr, or an alloy thereof is used as the lower layer, it is desirable that the film thickness be from 10 to 100 Angstroms. This is because with a film thickness of less than 10 Angstroms there is a loss of effect as a lower layer, and with a film thickness of greater than 100 Angstroms the lower layer changes from the amorphous state to the crystalline state, thereby reducing its effectiveness as a lower layer.

It is a feature of the present invention that a magnetic thin film formed by at least one layer is laminated on these lower layers, the average surface unevenness of the surface of the magnetic thin film being in the range from 0.1 to 5 Angstroms. The result of this is that the continuity, that is, the uniformity of the film thickness, of the tunnel barrier layer laminated thereover is maintained, and oxidation of the magnetic thin film at the boundary with the tunnel barrier layer is suppressed, thereby achieving a larger resistance change. An additional result is an improvement in deterioration that would be caused by thermal processing of the tunnel barrier layer.

It is preferable that the anti-ferromagnetic material used in the anti-ferromagnetic thin film of the present invention be selected as one or at least two types from a group consisting of PtMn, PtMn-X (where X is Ru, Ir, Cr, Fe, Co, Ni, Pd, or Rh), PdMn, and NiMn. It is desirable that the film thickness of the anti-ferromagnetic thin film be in the range from 50 to 350 Angstroms.

At below 50 Angstroms, the phase change of these anti-ferromagnetic thin films is insufficient, so that a sufficient exchange bias magnetic field is not obtained. Although there is no upper limit in terms of obtaining an exchange bias magnetic field, if the thickness exceeds 350 Angstroms, the spacing between the shields in the spin tunnel magnetoresistive effect element becomes large, so that there is a worsening of the reading accuracy of an external signal.

In the present invention, by laminating neighboring ferromagnetic layers onto the lower layer, there is an improvement in the layer structure of the spin tunnel magnetoresistive effect film, and it becomes possible to achieve a large magnetoresistive change ratio. The average surface roughness of the anti-ferromagnetic layer is improved by using Ta, Hr, Zr, or an alloy thereof in the lower layer, and it is particularly desirable that this be in the range from 0.1 to 5 Angstroms. In the case in which the average surface roughness exceeds 5 Angstroms, the surface roughness in the boundary layer of the magnetic thin film or the like that is laminate thereover increases, and there is a worsening of the uniformity of the film thickness of the tunnel barrier layer.

By keeping the average surface roughness of the anti-ferromagnetic layer in the range from 0.1 to 5 Angstroms, there is a clear boundary at the magnetic thin film or the like laminate thereover, and there is an improvement in deterioration of the tunnel barrier layer with thermal processing and the accompanying lowering of resistance change. In the present invention, the anti-ferromagnetic thin film and neighboring magnetic thin film laminated thereover are thermally processed at 200° C. to 300° C. in a magnetic field, thereby enabling the achievement of uniaxial anisotropy in the magnetic thin film.

In the present invention, in order to achieve an average surface roughness of the above-noted magnetic thin film surface in the range from 0.1 to 5 Angstroms, oxygen, nitrogen, hydrogen, or a gas mixture thereof is introduced into the film formation chamber at a partial pressure ranging from $10^{-6}$ Torr to $10^{-9}$ Torr.

By causing appropriate oxidation of the lower layer material surface, crystal grain growth of the magnetic thin film laminated thereover is suppressed, making it possible to reduce the average surface roughness. It is effective in controlling the average surface roughness of the magnetic thin film in the range from 0.5 to 5 Angstroms, to cool the substrate to below 0° C. during the film formation. When this is done, crystal grain growth is suppressed in the magnetic thin film, making it possible to achieve a laminate with better flatness.

It is preferable that the lower electrode material in a tunnel magnetoresistive effect element according to the present invention be a laminate of an amorphous magnetic material having a high permeability and effectiveness as a shield and a non-magnetic metal conductive layer. In this case the high-permeability amorphous material has the effect of improving the flatness of the tunnel magnetoresistive effect film, and it is possible to achieve the same kind of effect as with a non-magnetic metallic conductive layer. It is preferable that the high-permeability amorphous magnetic material be an alloy having CoZr as a major constituent component. More specifically, this can be CoZrNb, CoZrMo, CoZrTa, or CoZrTaCr or the like.

Although there is no particular restriction with regard to the metallic conductive layer that is laminated with the above, it is desirable that this be at least one layer of types of Ta, Zr, Hf, Pt, Ru, Au, Cu, or Mo or an alloy or two or more types thereof, which has good flatness laminated over the amorphous magnetic layer.

The tunnel barrier layer of the present invention has as a feature that it is at least two layers of an oxide or nitride film of Al, a Ta oxide film, or an Mg oxide film. This achieves the formation of a stable tunnel barrier, and enables the achievement of a high magnetoresistive change ratio. The tunnel barrier layer of the present invention is formed by introducing oxygen, nitrogen or a gas that includes an oxygen radical or a nitrogen radical into a vacuum of $10^{-7}$ Torr to $10^{-10}$ Torr, and performing either oxidation or nitridation.

By doing this, contamination by water content, by carbon oxides, or by nitrogen oxides is suppressed, making it possible to achieve good control of the element resistance and good uniformity. From experimental values, it is desirable that the thickness of the tunnel barrier layer be in the range from 3 to 12 Angstroms.

That is, if the tunnel barrier layer becomes thicker than 12 Angstroms, there is a prominent increase in the tunnel junction resistance, causing a worsening of the high-frequency response, this being undesirable for use as a magnetoresistive effect element. On the other hand, the film thickness is below 3 Angstroms, the mutual interaction between magnetic phases of the magnetic thin films becomes excessively large, and it Is not possible to avoid the occurrence of direct magnetic contact (pinholes), thereby resulting in a condition in which there is a difference in the magnetization directions of the two magnetic thin films. The influence of leakage current passing through a pinhole becomes prominent, and there is a decrease in the magnetoresistive change ratio. It is preferable that the magnetic material used in the magnetic thin film of the present invention be NiFe, Co, FeCo, NiFe, NiFeCo or an alloy thereof.

By doing the above, it is possible to achieve a large spin polarization at the boundary between the tunnel barrier layer and the magnetic thin film, thereby achieving a greater resistance change ratio. In the present invention, the magnetic thin film is formed by selection from these magnetic materials. In particular, this is achieved because, of the two magnetic thin films laminated with an intervening tunnel barrier layer, the material of the magnetic thin film (second magnetic thin film) not neighboring the anti-ferromagnetic thin film has an anisotropic magnetic field Hk2 that is larger than the coercivity Hc2.

The anisotropic magnetic field can also be made large by making the film thickness small. For example, if the NiFe thickness is made approximately 10 Angstroms, it is possible to make the anisotropic magnetic field Hk2 larger than the coercivity Hc2.

Additionally, in a spin tunnel magnetoresistive effect film as noted above the axis of easy magnetization of the magnetic thin film is in a direction perpendicular to the signal magnetization direction, and the coercivity of the magnetic thin film in the applied signal field direction is such that Hc2<Hk2<Hr. If the easy magnetization axis is set up to be perpendicular to the signal magnetic field direction in this manner, it is possible to suppress Barkhausen noise. Additionally, control of the axis of easy magnetization in this manner can be done during fabrication, by forming the film in a magnetic field.

Of the two magnetic thin film laminated with a tunnel barrier layer therebetween, the easy magnetization axis direction of the magnetic thin film neighboring the anti-ferromagnetic film (first magnetic thin film) and the easy magnetization axis direction of the magnetic thin film (second magnetic thin film) that is not next to the anti-ferromagnetic are made to cross perpendicularly. This can also be achieved by causing a 90-degree rotation of the substrate in a magnetic field.

It is desirable that the film thickness of the magnetic thin film (second magnetic thin film) that detects a magnetic field be less than 100 Angstroms. If the film thickness exceeds 200 Angstroms, there is an accompanying the influence on the counter magnetic when used as an element becomes large, and there is a worsening of the sensitivity with respect to an external magnetic field. On the other hand, if the thickness of the magnetic thin film is below 3 Angstroms, there is a tendency for discontinuities to occur in the magnetic thin film, thereby reducing the magnetoresistive change. It is particularly desirable to make the thickness of the film greater than 3 Angstroms, as this facilitates maintenance of the uniformity of the thin film.

Additionally, the saturation magnetization does not become excessively small. By inserting Co, Fe, FeCo, or NiFeCo at the boundary between the magnetic thin film and the tunnel barrier layer, there is an increase in the spin polarization of the conduction electrons, making it possible to achieve an even greater resistance change. The lower limit on thickness of the inserted film is 1 Angstrom. Below this thickness, there is not only a reduction in the effectiveness of insertion, but also difficulty controlling the film thickness.

Although there is no particular upper limit on the film thickness, it is desirable that this be approximately 20 Angstroms. At above this thickness, there is a worsening of soft magnetic properties of the magnetic thin film (the second thin film), which can detect the magnetic field, and the output in the operating region of the magnetoresistive effect element exhibits hysteresis.

In the present invention, it is possible to adopt a configuration in which a three-layer magnetic film/non-magnetic thin film/magnetic film anti-ferromagnetically coupled between the anti-ferromagnetic film and the magnetic thin film (first magnetic thin film) that is neighboring the anti-ferromagnetic film.

By doing this, there is a prominent rise in the exchange bias field due to the anti-ferromagnetic film, and an improvement in the thermal stability of the spin tunnel magnetoresistive effect element. The is additionally a reduction in the static interaction between the second magnetic thin film that detects a magnetic field and the first magnetic thin film, and an improvement in the output of the spin tunnel magnetoresistive effect element. It is desirable that the non-magnetic thin film in the three-layer film that is anti-ferromagnetically coupled be Ru, Cr, Rh, Ir, or a two or more members selected from this group.

By doing this, the saturation magnetic field of the anti-ferromagnetically coupled three-layer film becomes large, and there is an improvement in the thermal stability when used as a spin tunnel magnetoresistive effect element. If this is done, it is desirable that the thickness of the non-magnetic thin film in the anti-ferromagnetically coupled three-layer film be in the range from 4 to 10 Angstroms, as this achieves an extremely large anti-ferromagnetic coupling field. The magnetic layer of the anti-ferromagnetically coupled three-layer film is made of Co, FeCo, NiFe, or NiFeCo. By using these materials, not only is a large anti-ferromagnetic coupling achieved, but also a large resistance change is achieved as well. Additionally, in a spin tunnel magnetoresistive effect film such as described above, by bringing a permanent magnet film into contact with the easy magnetization direction of the magnetic thin film that detects an external magnetic field (second magnetic thin film), this being the magnetic thin film that does not neighbor the anti-ferromagnetic film, it is possible to achieve magnetic domain stability and avoid non-linear output, such as due to Barkhausen jumping.

It is desirable that the permanent magnet film be CoCr, CoCrTa, CoCrTaPt, CoCrPt, CoNiPt, CoNiCr, CoCrPtSi, or FeCoCr or the like. It is possible to use Cr as an underlayer for such permanent magnet films. It is possible to use glass, Si, MgO, $Al_2O_3$, GaAs, ferrite, $CaTi_2O_3$, $BaTi_2O_3$, $Al_2O_3$—TiC or the like as a substrate.

The film thickness of a magnetic or non-magnetic thin film can be measured by a transmission electron microscope, a scanning electron microscope, an auget electron spectrometer, or the like. The crystalline structure of the thin film can be verified by using X-ray diffraction, or by using high-speed electron beam diffraction. It is possible to measure the average roughness of a thin film using an atomic force (electron) microscope.

In a spin tunnel magnetoresistive effect film according to the present invention, it is possible to laminate Ta, Hf, Zr, or Ti or the like onto the uppermost layer as a protective film to suppress oxidation.

DETAILED DESCRIPTION OF THE PREFERRED EMBODIMENTS

Embodiments of the present invention are described in detail below, with reference made to relevant accompanying drawings.

In a spin tunnel magnetoresistive effect element according to the present invention an anti-ferromagnetic thin film is formed adjacent (or adjacent to via an intervening anti-ferromagnetically coupled three-layer film therebetween) to one of the magnetic thin films, and it is necessary that an exchange bias be operative.

Figure 4A:
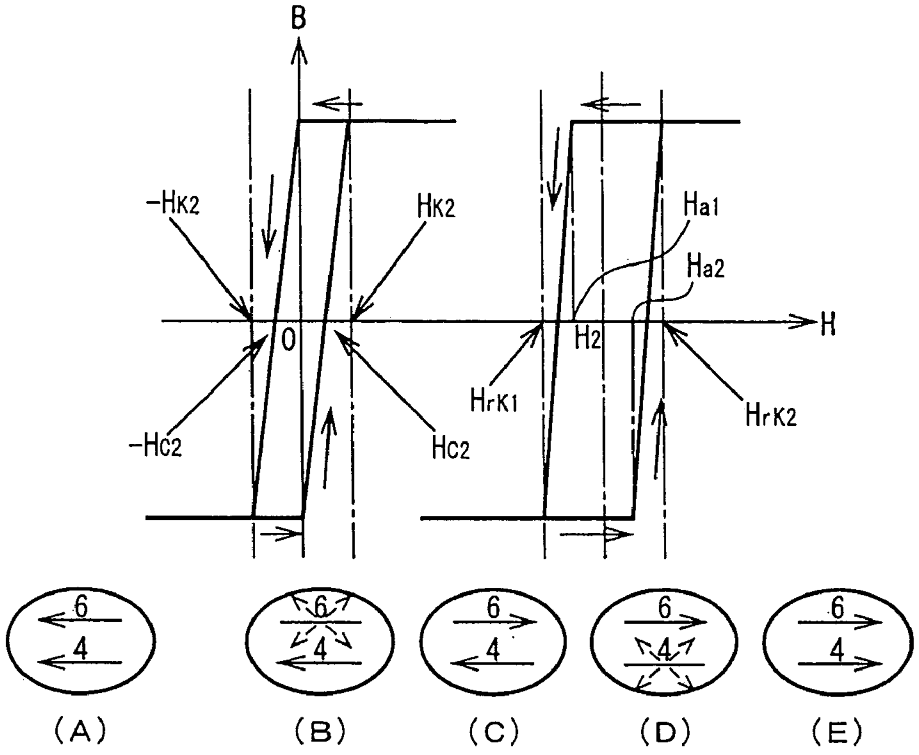
FIG. 4(*a*) is a B-H curve graph illustrating the operating principle of a spin tunnel magnetoresistive effect element according to the present invention, and FIG. 4(*b*) is a R-H curve graph illustrating the operating principle of a spin tunnel magnetoresistive effect element according to the present invention.
Figure 4B:
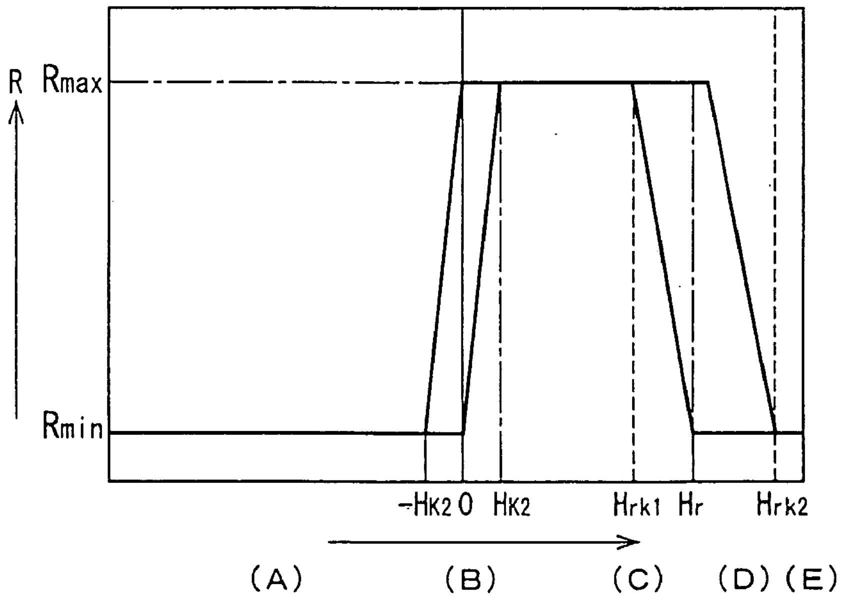
Figure 5A:
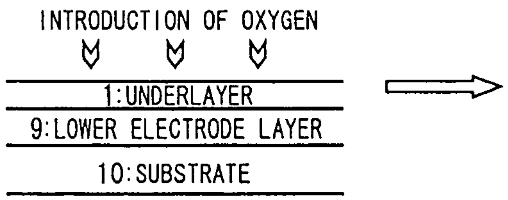
FIG. 5 is simplified drawing illustrating the manufacturing process for a spin tunnel magnetoresistive effect film according to an embodiment of the present invention.
Figure 5B:
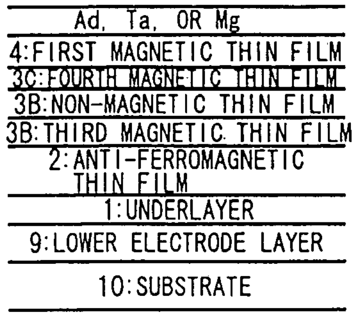
Figure 5C:
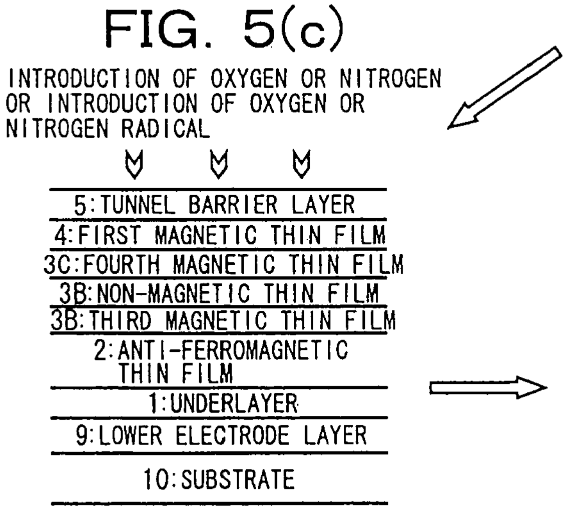
Figure 5D:
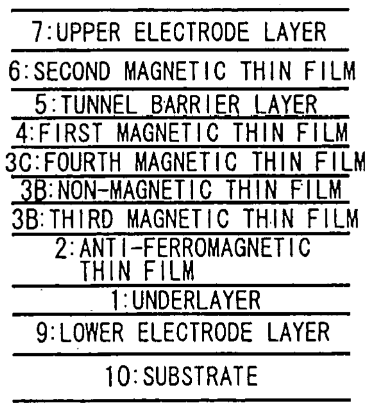

The reason for this is that the principle of the present invention is one in which, when the magnetization orientations of neighboring magnetic thin films are mutually opposite, the maximum resistance is exhibited. Thus, in the present invention, as shown in FIG. 4(*a*) when an external magnetic field H is between the anisotropic magnetic field Hk2 of the magnetic thin film and the coercivity Hr of one of the magnetic thin films, that is, when Hk2<H<Hr, the magnetization directions of neighboring magnetic thin films are mutually opposite, and the resistance increases.

Figure 3:
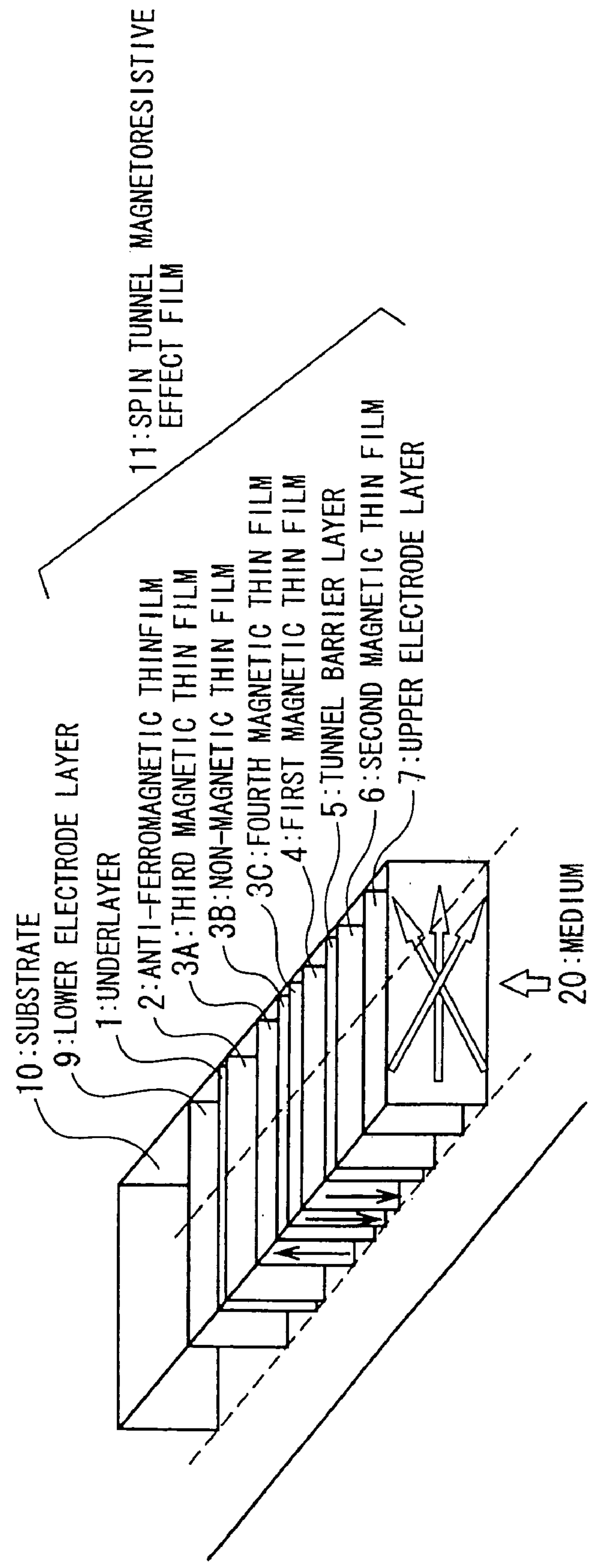
FIG. 3 is an oblique view showing an example of the configuration of a spin tunnel magnetoresistive sensor according to an embodiment of the present invention.

FIG. 3 is an oblique view of one example of a magnetoresistive (MR) effect element using a spin tunnel magnetoresistive effect film according to the present invention. This MR sensor, as shown in FIG. 3, is formed by a spin tunnel magnetoresistive effect film 11 formed on a substrate 10, over which substrate 10 is formed a first anti-ferromagnetic film, the axes of easy magnetization of magnetic thin films 4 and 6, with a tunnel barrier layer 5 therebetween, being caused to cross perpendicularly, and the signal magnetic field released from the magnetic recording medium being perpendicular to the easy magnetization direction of the magnetic thin film 6.

Under the above-noted conditions, the first magnetic thin film 4 neighbors to the anti-ferromagnetically coupled three-layer film formed by 3A, 3B, and 3C, and (the) an exchange bias magnetic field is applied by the anti-ferromagnetic magnetic thin film 2, so as to impart uniaxial anisotropy. By the rotation of the direction of magnetization of the second magnetic thin film 6 in response to the strength of the signal magnetic field, the field is detected by the change in resistance. The element resistance greatly affects the frequency response or S/N ratio in a magnetoresistive detection system, and at 100 Ω or greater it is insufficient for use as a magnetic head.

Because the output is proportional to the element resistance, it is necessary for the element resistance to be in the approximate range from 40 Ω to 100 Ω. The relationship among the external magnetic field, the coercivity, and the magnetization direction is as follows.

As shown in FIG. 4(*a*), the exchange bias on the exchange biased magnetic thin film (first magnetic thin film) 4 is Hr, the coercivity of the other magnetic thin film (second magnetic thin film) 6 is Hc2, and the anisotropic magnetic field is Hk2 (0<Hk2<Hr).

An exchange biased magnetic thin film generally exhibits hysteresis, with a reversed magnetic field of Hrk2 with respect to a positive magnetic field and a reversed magnetic field of Hrk1 with respect to a negative magnetic field. Under these conditions, the relationship Hr=((Hrk1+Hrk2)/2 is satisfied. At first the magnetic field H is applied so that H<−Hk2 (region (A)). At this time, the magnetization directions of the magnetic thin films 4 and 6 are the same as H (negative).

Next, as the external magnetic field weakens, in the condition −Hk2<H<Hk2 (region (B)), the magnetization of the magnetic thin film 6 rotates in the plus direction, and in the condition Hk2<H<Ha2 (region (C)), the magnetization directions of the magnetic thin films 4 and 6 are opposite. If the external magnetic field is made even larger, so that Ha2<H<Hrk2 (region (D)), the magnetization of the magnetic thin film 4 also reverses, and in the condition Hrk2<H (region (E)), the magnetization directions of both the magnetic thin film 4 and the magnetic thin film 6 are in the plus direction.

As shown in FIG. 4(*b*), the resistance of this film changes in accordance with the relative magnetization directions of the magnetic thin films 4 and 6, this change being linear in the region of a zero magnetic field, and taking a maximum value (Rmax) in the region (C).

Figure 1A:
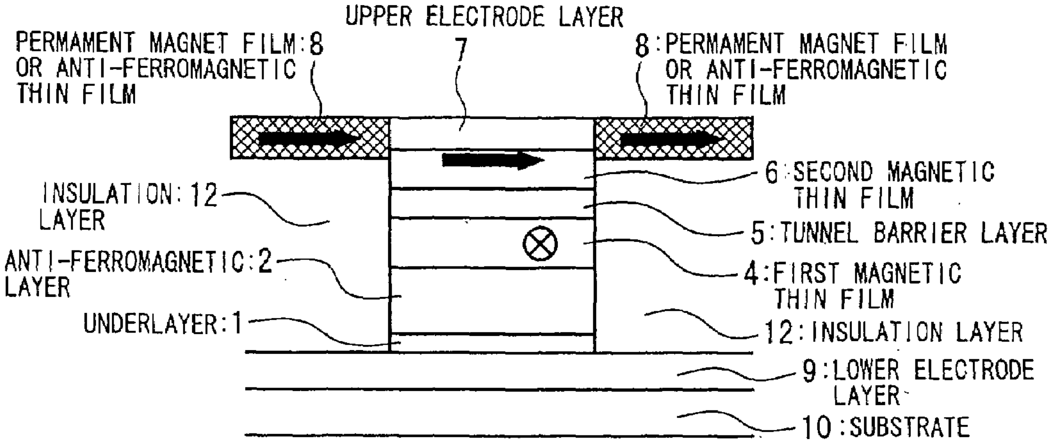
FIG. 1(*a*) is a partial cross-sectional view of a spin tunnel magnetoresistive effect element in a first embodiment of the present invention, and FIG. 1(*b*) is a partial cross-sectional view of a spin tunnel magnetoresistive effect element in a second embodiment of the present invention.
Figure 1B:
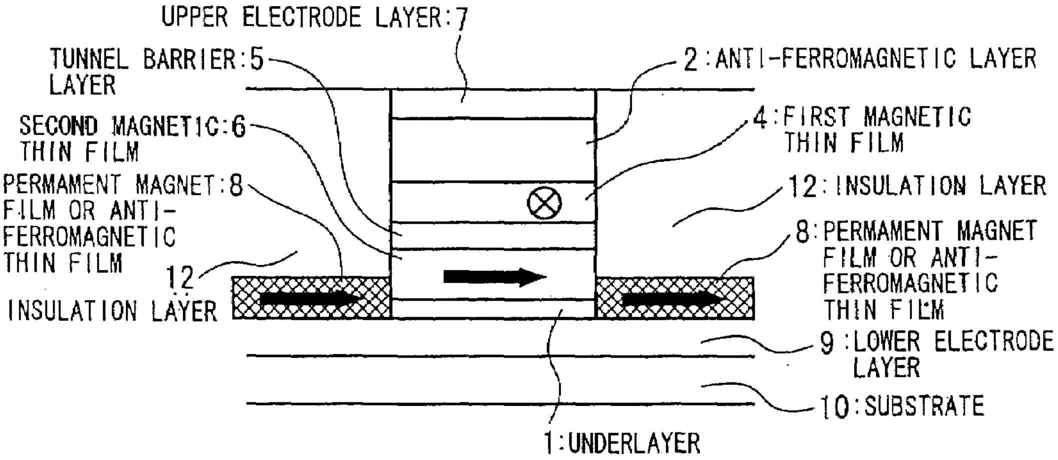

An embodiment of a spin tunnel magnetoresistive effect element according to the present invention is described below, with references made to relevant accompanying drawings. FIG. 1(*a*), FIG. 1(*b*), FIG. 2(*a*), and FIG. 2(*b*) are cross-sectional view showing the configurations of embodiments of a spin tunnel magnetoresistive effect element according to the present invention.

In FIG. 1(*a*), the spin tunnel magnetoresistive effect element has a lower electrode layer 9, an underlayer 1, and an anti-ferromagnetic thin film 2 formed on a substrate 10, over which is formed a first magnetic thin film 4 and a second magnetic thin film 6, a tunnel barrier layer 5 being disposed between the first magnetic thin film 4 and the second magnetic thin film 6. There is additionally an upper electrode layer 7 over the above arrangement.

In the above structure, the magnetic thin films are made up of at least one layer of FeCo, NiFe, and NiFeCo.

An anti-ferromagnetic thin film or permanent magnet thin film 8 is disposed so as to be in contact with both side surfaces of the second magnetic thin film 6.

In FIG. 1(*b*), the spin tunnel magnetoresistive effect element has a lower electrode 9, an underlayer 1, a second magnetic thin film 6, and a first magnetic thin film 4, and further has a tunnel barrier layer 5 between the first magnetic thin film 4 and the second magnetic thin film 6. There is additionally an anti-ferromagnetic thin film 2 and an upper electrode layer 7 over the above arrangement.

An anti-ferromagnetic thin film or permanent magnet thin film 8 is disposed so as to be in contact with the second magnetic thin film 6.

Figure 2A:
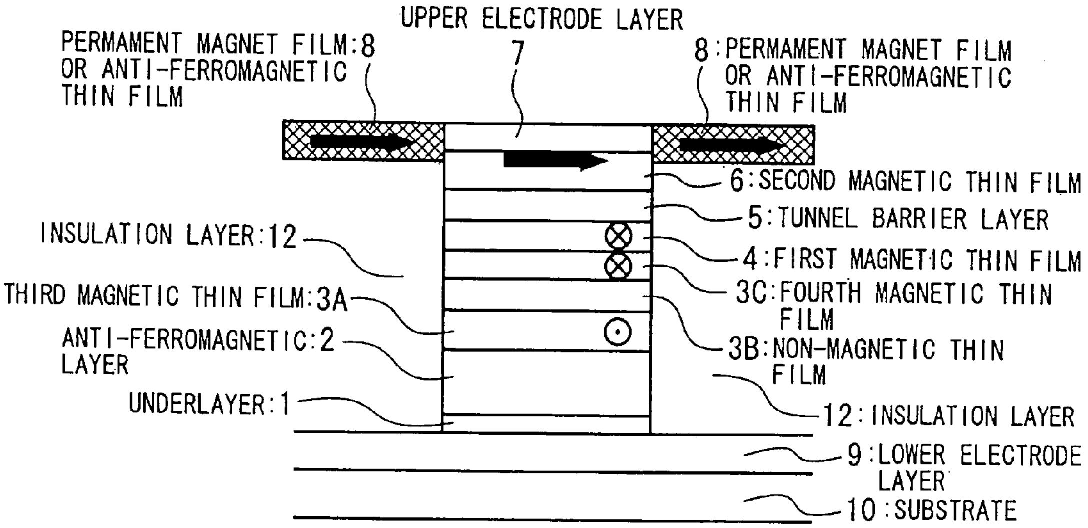
FIG. 2(*a*) is a partial cross-sectional view of a spin tunnel magnetoresistive effect element in a third embodiment of the present invention, and FIG. 2(*b*) is a partial cross-sectional view of a spin tunnel magnetoresistive effect element in a fourth embodiment of the present invention.
Figure 2B:
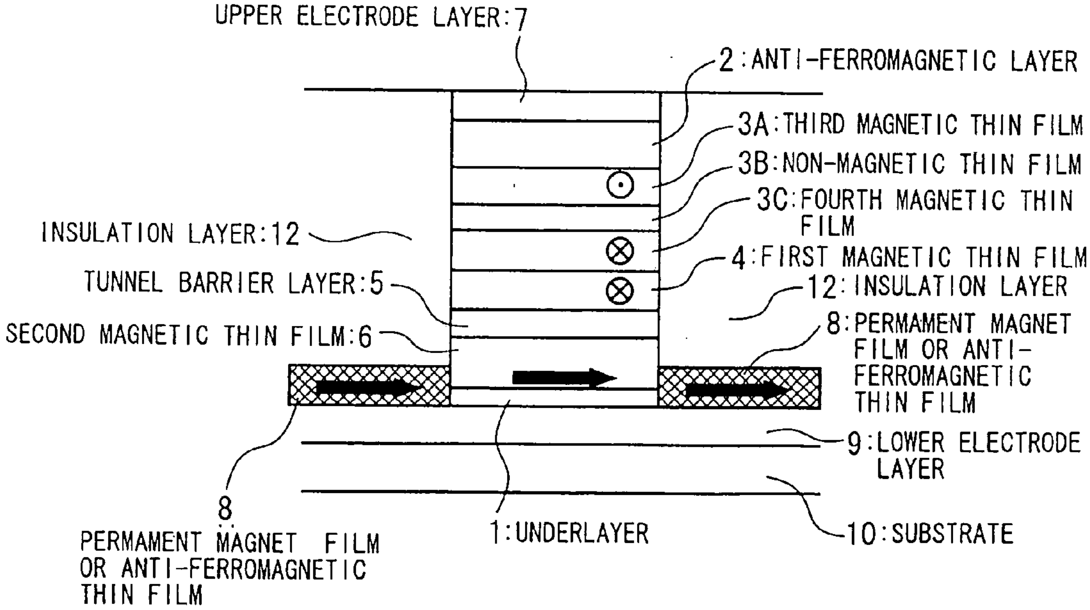

In FIG. 2(*a*), the spin tunnel magnetoresistive effect element has a lower electrode layer 9, an underlayer 1 and a anti-ferromagnetic thin film 2 formed on a substrate 10, over which are formed an anti-ferromagnetically coupled third and fourth magnetic thin films 3A an 3C with the interposing the non-magnetic thin film therebetween, and a first magnetic thin film 4, which is in neighboring contact therewith. Over this is further formed a tunnel barrier layer 5, and the lamination of the second magnetic thin film 6 and the an upper electrode layer 7.

An anti-ferromagnetic thin film or permanent magnet thin film is disposed so as to be in contact with the second magnetic thin film 6.

In FIG. 2(*b*) the spin tunnel magnetoresistive effect element has a lower electrode layer 9, an underlayer 1, a second magnetic thin film 6, and a tunnel barrier layer 5. Over this, the element has a first magnetic thin film 4, and anti-ferromagnetically coupled fourth and third magnetic thin films 3C and 3A, with an intervening non-magnetic thin film 3B therebetween, further over which is laminated an anti-ferromagnetic thin film 2 and an upper electrode layer 7. An anti-ferromagnetic thin film or permanent magnet thin film 8 is disposed so as to be in contact with the second magnetic thin film 6.

The arrows in the above-noted FIG. 1(*a*) and FIG. 2(*b*) indicate the formation of an axis of easy magnetization parallel to the plane of the drawing, and in the same manner the Xs in the circles therein indicate formation of an axis of easy magnetization pointing toward the viewer from the rear of the drawings, these being perpendicular to plane of the drawings. The circles with black dots therein indicate formation of an axis of easy magnetization pointing away from the viewer from the front of the drawings, these also being perpendicular to plane of the drawings.

The present invention is described below in the form of embodiments thereof, with regard to the materials recited in the attached claims, (arrived at) from the results of experiments.

FIG. 5 shows the film forming process of a spin tunnel magnetoresistive effect film according to the present invention.

An AlTiC substrate is used, this being placed in a vacuum apparatus, in which a vacuum of $10^{-8}$ Torr or less is created. The substrate temperature is maintained from room temperature to the temperature of liquid nitrogen, and a lower electrode layer 9 and an underlayer 1 (Ta, Zr, Hf) are grown, oxygen is introduced at an appropriate partial pressure (preferably from $10^{-2}$ to $10^{-8}$ Torr), and the surface is caused to oxidize.

The oxidation step is performed by generating a vacuum of no greater than $10^{-7}$, and preferably lower than $10^{-10}$ Torr, after which oxygen is introduced at a prescribed partial pressure. After this is done, oxygen or hydrogen or nitrogen is introduced with a partial pressure in the range from $10^{-6}$ to $10^{-9}$ Torr (or more preferably $10^{-7}$ to $10^{-8}$ Torr).

Then the anti-ferromagnetic thin film 2 and the magnetic thin films 3A, 3B, 3C and so on are successively formed. In doing this, it is preferable when forming the anti-ferromagnetic thin film 2 and the magnetic thin films and the like that the substrate temperature be no greater than 0° C.

By controlling the substrate temperature in this manner, it is possible to flatten the average surface roughness of the films that are formed.

Next, a film is formed of Al or Ta or Mg, which will serve as the first magnetic thin film 4 and the tunnel barrier layer 5, continuously after which the vacuum level is brought to within the range from $10^{-7}$ to $10^{-10}$ Torr, oxygen, nitrogen, or a gas having an oxygen or nitrogen radical being introduced, and the Al, Ta, or Mg being thereby oxidized or nitridized to form the tunnel barrier layer 5.

A second magnetic thin film 6, which detects a magnetic field, and an upper electrode layer 7 are formed over the above structure. When this is done, the magnetic field applied during the film formation is rotated 90° during the film formation, so that the axis of easy magnetization of the first magnetic thin film 4 neighboring the anti-ferromagnetic thin film 2 and the axis of easy magnetization of the second magnetic thin film 6 neighboring thereto with an intervening tunnel barrier layer 5 are perpendicular to one another.

Next, the above-noted laminate is placed in a heating furnace and, as a DC magnetic field of 3 kOe to 20 kOe is applied to the easy magnetization direction of the exchange coupling layer, thermal processing is done at 200° to 300° C., this becoming the spin tunnel magnetoresistive effect film.

More specifically, the film formation is done by placing NdFeB magnets at both sides of the substrate, and applying an external magnetic field of approximately 3000 Oe parallel to the substrate.

If the B-H curve of this sample is measured, the direction of application of the magnetic field during the formation of the field becomes the axis of easy magnetization of the magnetic thin film. The spin tunnel magnetoresistive effect film shown below is formed at a film growth rate of approximately 0.2 Angstrom to 2.0 Angstrom per second for the magnetic thin film and the non-magnetic thin film.

The indication of Sub/CoZrTa (1 μm)/Zr (30 Å)/PtMn (250)/CoFe (30)/Al (7)-ox/CoFe (10)/NiFe(60)/Zr(30), for example, means successive formation of films on the substrate in the sequence of a 1-micrometer CoZrTa thin film, a 30-Angstrom Zr thin film, a 250-Angstrom PtMn anti-ferromagnetic thin film, a 30-Angstrom CoFe thin film, a 7-Angstrom Al thin film, and then a oxdizing process had been performed, followed by a 10-Angstrom CoFe thin film, a 60-Angstrom NiFe thin film, and a 30-Angstrom Zr thin film.

The thus formed spin tunnel magnetoresistive effect film is subjected to ion milling and photolithography so as to form the element shape. First photoresist (PR) having the shape of the underlayer is formed, and milling is done up to the lowermost layer electrode.

After the above, the photoresist is removed, and (the) a new photoresist having the size of the junction is formed over the spin tunnel magnetoresistive effect film (TMR film) of the shape of the lower electrode, and milling is done up until the barrier layer.

Then, leaving the junction-size photoresist in place, an insulation layer ($Al_2O_3$) is grown between the electrodes. After that, the junction-size photoresist is removed, and an upper electrode layer is further formed. After forming the upper electrode layer shaped photoresist, ion milling is done to machine the upper electrode and then the photoresist is removed, at which point the element processing is completed. The resistance value of the completed element was measured using the four-terminal method, and magnetoresistive characteristics were evaluated.

The magnetoresistive measurement was made using the four-terminal method, while varying the external magnetic field from −700 Oe to +700 Oe, so that it is perpendicular to the current flow within the surface, and the magnetoresistive change ratio ΔR/R was determined from the measured resistance values. The magnetoresistive change ratio ΔR/R was calculated as follows, with the maximum resistance value being Rmax and the minimum resistance value being Rmin.

$$\Delta R/R=(R\text{max}-R\text{min})/R\text{min}\ 100\ (\%)$$

The junction resistance of the spin tunnel magnetoresistive effect element was normalized with respect to the resistance in the case in which the element size was patterned to 1 μm square (the element resistance being the resistance when the spin tunnel magnetoresistive effect film is machined to the desired element size).

Using an atomic force microscope, the average surface roughness were measured (as a surface roughness) over 0.1 μm square.

The measurement of magnetization was performed using a vibrating sample magnetometer.

The fabricated spin tunnel magnetoresistive effect films are shown below.

1. Al—Ox Tunnel Barrier Layer a. Sub/CoZrX(1 μm)/(Ta,Zr,Hf,Ti)(10–100 Å)/NiMn (30–400)/CoFe(10–100)/Al(3–20)-Ox/CoFe(1–40)/NiFe (1–100)/Ta(5–50)

b. Sub/CoZrX(1 μm)/(Ta,Zr,Hf,Ti)(10–100 Å)/PdMn (30–400)/CoFe(10–100)/Al(3–20)-Ox/CoFe(1–40)/NiFe (1–100)/Ta(5–50)

c. Sub/CoZrX(1 μm)/(Ta,Zr,Hf,Ti)(10–100 Å)/PtMn (30–400)/CoFe(10–100)/Al(3–20)-Ox/CoFe(1–40)/NiFe (1–100)/Ta(5–50)

d. Sub/CoZrX(1 μm)/PtMn(30–400)/CoFe(10–100)/Al (3–20)-Ox/CoFe(1–40)/NiFe(1–100)/Ta(5–50)

e. Sub/CoZrX(1 μm)/(Ta,Zr,Hf,Ti)(10–100 Å)/FeMn (30–400)/CoFe(10–100)/Al(3–20)-Ox/CoFe(1–40)/NiFe (1–100)/Ta(5–50)

f. Sub/CoZrX(1 μm)/(Ta,Zr,Hf,Ti)(10–100 Å)/NiFe(1–100)/CoFe(1–40)/Al(3–20)-Ox/CoFe(10–100)/NiMn(30–400)/Ta(5–50)
g. Sub/CoZrX(1 μm)/(Ta,Zr,Hf,Ti)(10–100 Å)/NiFe(1–100)/CoFe(1–40)/Al(3–20)-Ox/CoFe(10–100)/PdMn(30–400)/Ta(5–50)
h. Sub/CoZrX(1 μm)/(Ta,Zr,Hf,Ti)(10–100 Å)/NiFe(1–100)/CoFe(1–40)/Al(3–20)-Ox/CoFe(10–100)/PtMn(30–400)/Ta(5–50)
i. Sub/CoZrX(1 μm)/NiFe(1–100 Å)/CoFe(1–40)/Al(3–20)-Ox/CoFe(10–100)/PtHn(30–400)/Ta(5–50)
j. Sub/CoZrX(1 μm)/(Ta,Zr,Hf,Ti)(10–100 Å)/NiFe(1–100)/CoFe(1–40)/Al(3–20)-Ox/CoFe(10–100)/FeMn(30–400)/Ta(5–50)

2. Al—Nx Tunnel Barrier Layer
a. Sub/CoZrX(1 μm)/(Ta,Zr,Hf,Ti)(10–100 Å)/NiMn(30–400)/CoFe(10–100)/Al(3–20)-Nx/CoFe(1–40)/NiFe(1–100)/Ta(5–50)
b. Sub/CoZrX(1 μm)/(Ta,Zr,Hf,Ti)(10–100 Å)/PdMn(30–400)/CoFe(10–100)/Al(3–20)-Nx/CoFe(1–40)/NiFe(1–100)/Ta(5–50)
c. Sub/CoZrX(1 μm)/(Ta,Zr,Hf,Ti)(10–100 Å)/PtMn(30–400)/CoFe(10–100)/Al(3–20)-Nx/CoFe(1–40)/NiFe(1–100)/Ta(5–50)

3. Ta—Ox Tunnel Barrier Layer
a. Sub/CoZrX(1 μm)/(Ta,Zr,Hf,Ti)(10–100 Å)/NiMn(30–400)/CoFe(10–100)/Ta(3–20)-Ox/CoFe(1–40)/NiFe(1–100)/Ta(5–50)
b. Sub/CoZrX(1 μm)/(Ta,Zr,Hf,Ti)(10–100 Å)/PdMn(30–400)/CoFe(10–100)/Ta(3–20)-Ox/CoFe(1–40)/NiFe(1–100)/Ta(5–50)
c. Sub/CoZrX(1 μm)/(Ta,Zr,Hf,Ti)(10–100 Å)/PtMn(30–400)/CoFe(10–100)/Ta(3–20)-Ox/CoFe(1–40)/NiFe(1–100)/Ta(5–50)

4. Mg—Ox Tunnel Barrier Layer
a. Sub/CoZrX(1 μm)/(Ta,Zr,Hf,Ti)(10–100 Å)/NiMn(30–400)/CoFe(10–100)/Mg(3–20)-Ox/CoFe(1–40)/NiFe(1–100)/Ta(5–50)
b. Sub/CoZrX(1 μm)/(Ta,Zr,Hf,Ti)(10–100 Å)/PdMn(30–400)/CoFe(10–100)/Mg(3–20)-Ox/CoFe(1–40)/NiFe(1–100)/Ta(5–50)
c. Sub/CoZrX(1 μm)/(Ta,Zr,Hf,Ti)(10–100 Å)/PtMn(30–400)/CoFe(10–100)/Mg(3–20)-Ox/CoFe(1–40)/NiFe(1–100)/Ta(5–50)

5. CoFe/(Ru,Cr,Rh,Ir)/CoFe Magnetic Layer
a. Sub/CoZrX(1 μm)/(Ta,Zr,Hf,Ti)(10–100 Å)/PtMn(30–400)/CoFe(10–50)/(Ru,Cr,Rh,Ir)(4–16)/CoFe(10–50)/NiFe(0–40)/Al(3–20)-Ox/CoFe(1–40)/NiFe(1–100)/Ta(5–50)
b. Sub/CoZrX(1 μm)/(Ta,Zr,Hf,Ti)(10–100 Å)/PtMn(30–400)/CoFe(10–50)/(Ru,Cr,Rh,Ir)(4–16)/CoFe(10–50)/NiFeCo(0–40)/Al(3–20)-Ox/CoFe(1–40)/NiFe(1–100)/Ta(5–50)
c. Sub/CoZrX(1 μm)/(Ta,Zr,Hf,Ti)(10–100 Å)/PtMn(30–400)/CoFe(10–50)/(Ru,Cr,Rh,Ir)(4–16)/CoFe(10–50)/NiFe(0–40)/Al(3–20)-Nx/CoFe(1–40)/NiFe(1–100)/Ta(5–50)
d. Sub/CoZrX(1 μm)/(Ta,Zr,Hf,Ti)(10–100 Å)/PtMn(30–400)/CoFe(10–50)/(Ru,Cr,Rh,Ir)(4–16)/CoFe(10–50)/NiFeCo(0–40)/Al(3–20)-Nx/CoFe(1–40)/NiFe(1–100)/Ta(5–50)
e. Sub/CoZrX(1 μm)/(Ta,Zr,Hf,Ti) (10–100 Å)/PtMn(30–400)/CoFe(10–50)/(Ru,Cr,Rh,Ir)(4–16)/CoFe(10–50)/NiFe(0–40)/Ta(3–20)-Ox/CoFe(1–40)/NiFe(1–100)/Ta(5–50)
f. Sub/CoZrX(1 μm)/(Ta,Zr,Hf,Ti)(10–100 Å)/PtMn(30–400)/CoFe(10–50)/(Ru,Cr,Rh,Ir)(4–16)/CoFe(10–50)/NiFeCo(0–40)/Ta(3–20)-Ox/CoFe(1–40)/NiFe(1–100)/Ta(5–50)
g. Sub/CoZrX(1 μm))/(Ta,Zr,Hf,Ti)(10–100 Å)/PtMn(30–400)/CoFe(10–50)/(Ru,Cr,Rh,Ir)(4–16)/CoFe(10–50)/NiFe(0–40)/Mg(3–20)-Ox/CoFe(1–40)/NiFe(1–100)/Ta(5–50)
h. Sub/CoZrX(1 μm)/(Ta,Zr,Hf,Ti)(10–100 Å)/PtMn(30–400)/CoFe(10–50)/(Ru,Cr,Rh,Ir)(4–16)/CoFe(10–50)/NiFeCo(0–40)/Mg(3–20)-Ox/CoFe(1–40)/NiFe(1–100)/Ta(5–50)
i. Sub/CoZrX(1 μm)/(Ta,Zr,Hf,Ti)(10–100 Å)/NiFe(1–100)/CoFe(1–40)/Al(3–20)-Ox/NiFe(0–40)/CoFe(10–50)/(Ru,Cr,Rh,Ir)(4–16)/CoFe(10–50)/PtMn(30–400)/Ta(5–50)

Figure 6:
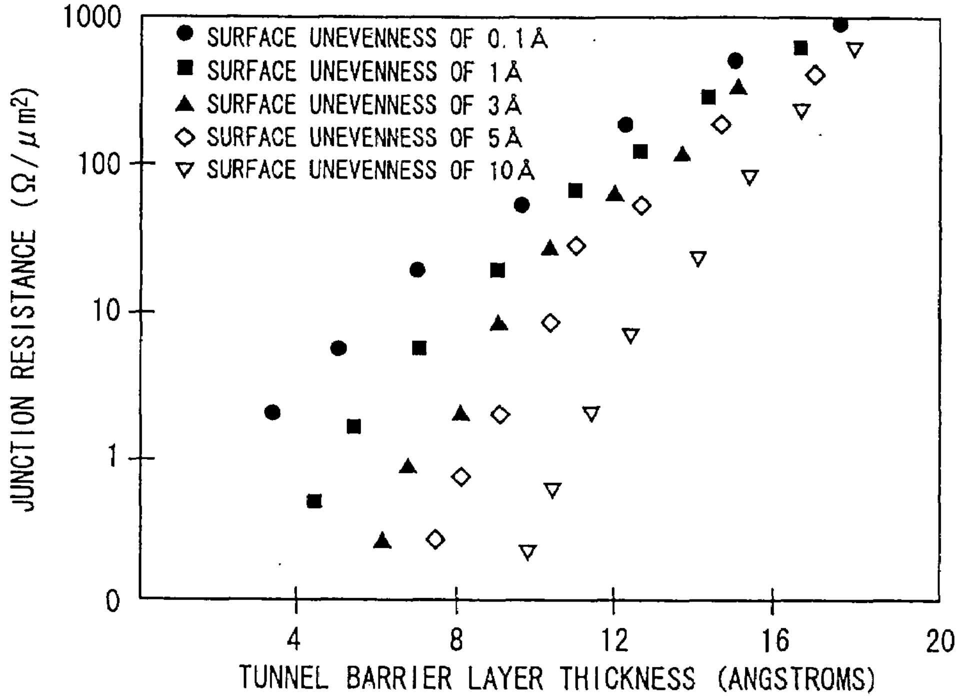
FIG. 6 is a graph showing the dependency of junction resistance in a spin tunnel magnetoresistive effect element of the present invention on the magnetic thin film surface roughness and on the barrier layer thickness.

FIG. 6 shows the dependency of junction resistance on the magnetic thin film surface roughness and on the barrier layer thickness.

The junction resistance used in the present invention is (was) normalized with respect to the resistance in the case in which the element size is 1 μm square. The surface height unevenness indicated in this drawing is represented as values of average surface height unevenness in the anti-ferromagnetic thin film (PtMn), with the makeup of the film being Sub/CoZrTa (1 μm)/Ta (100 Å)/PtMn (200)/CoFe (20)/Ru (6)/CoFe (20)/NiFe (10)/Al (3–20)-Ox/CoFe (10)/NiFe (50)/Ta (50).

With an increase in the average surface height unevenness, it can be seen that the effect of leakage current occurs when the barrier layer is formed, the junction resistance value decreasing. Even with the reversed lamination sequence of Sub/CoZrTa (1 μm)/Ta (10–100 Å)/NiFe (50)/CoFe (10)/Al (3–20)-Ox/NiFe (10)/CoFe (20)/Ru (6)/CoFe (20)/PtMn (200)/Ta (50), similar results were obtained.

Figure 7:
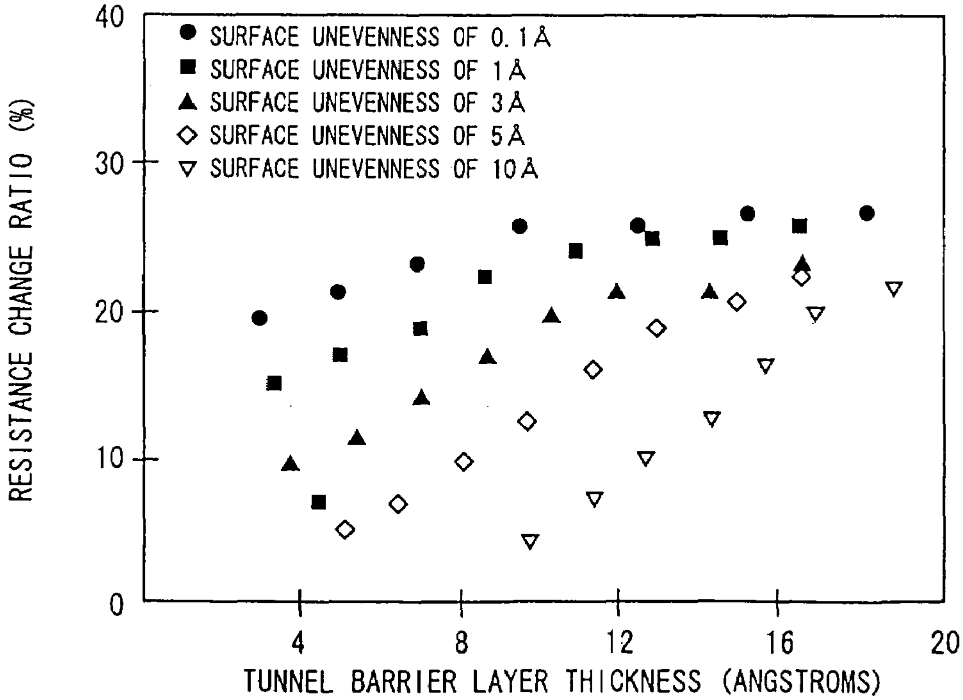
FIG. 7 is a graph showing the dependency of the resistance change ratio on the magnetic thin film surface roughness and the barrier layer thickness in a spin tunnel magnetoresistive effect element according to the present invention.

FIG. 7 shows the dependency of the resistance change ratio on the magnetic thin film surface roughness and the barrier layer thickness.

The film structure was the same as noted for FIG. 6, and it can be seen that, with an increase in the average surface height unevenness, the effect of leakage current occurs when the barrier layer is formed, the resistance change ratio decreasing.

That is, with an increase in the average surface roughness, when forming the tunnel barrier layer thin film, leakage current occurs, resulting in a prominent decrease in the resistance change ratio. In particular when the tunnel barrier layer is below 15 Angstroms the influence of average surface roughness control becomes great, and it can be seen that, in order to achieve a resistance change ratio of 15% or greater, it is necessary to make the average surface roughness no greater than 5 Angstroms.

In addition, referring to FIG. 6, in this case in order to make the junction resistance 100 $\Omega m^2$ or smaller (100 Ω or less for an element measuring 1 μm square) it is preferable that the tunnel barrier layer thickness be made an even smaller value of 12 Angstroms, and at a tunnel barrier layer thickness of 12 Angstroms and an average surface height unevenness of less than 5 Angstroms, it can be seen that it is possible to achieve both a high resistance change ratio and good high-frequency response.

These results were the same even in the case of reversing the lamination sequence.

Figure 8:
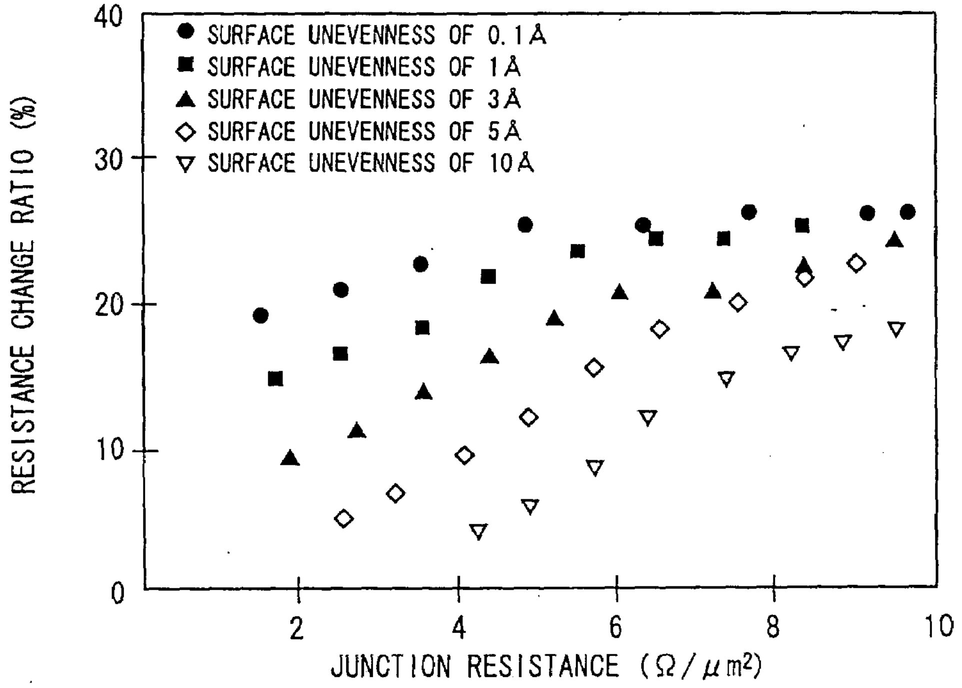
FIG. 8 is a graph showing the dependency of the resistance change ratio on the junction resistance and the magnetic thin film surface roughness in a spin tunnel magnetoresistive effect element according to the present invention.

FIG. 8 shows the dependency of the resistance change ratio on the junction resistance and the magnetic thin film surface roughness.

The film structure was the same as noted with regard to FIG. 6. It can be seen that, with an increase in the average surface roughness, in the low resistance region the resistance change ratio, that is, the output, exhibits a prominent decrease. That is, in order to achieve a high output at a low resistance, it is important to keep the average surface roughness of the magnetic thin film to no greater than 5 Angstroms.

In particular, because it can be envisioned that the shrinking of element sizes will continue in the future (with an element height of 1 μm or smaller and an element width of 1 μm or smaller), in order to maintain the good high-frequency response of an element, it is necessary to make the junction resistance small, and also to make an element having a high resistance change ratio.

The technology of the present invention is extremely effective as a technology for meeting the needs presented by the shrinking size of elements.

Figure 9:
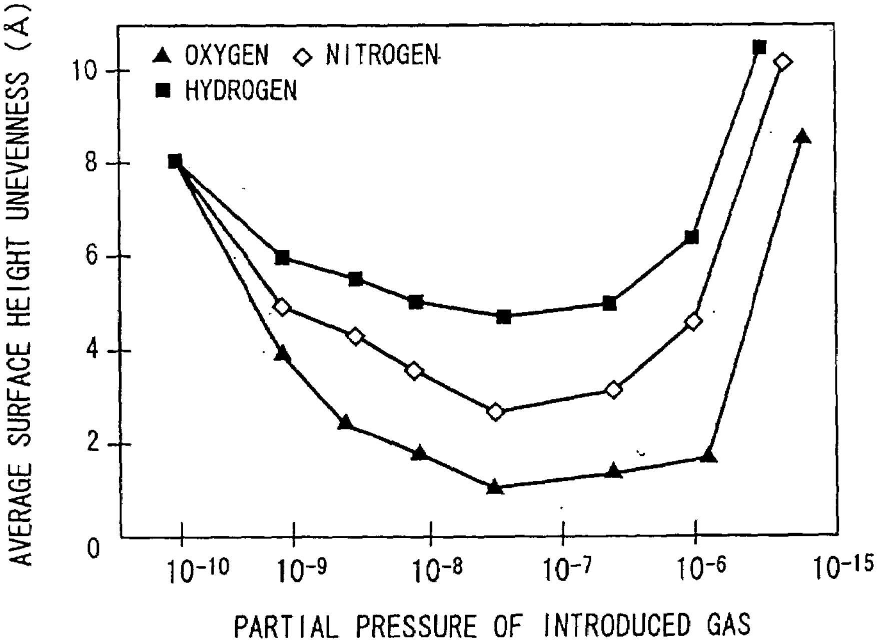
FIG. 9 is a graph showing the dependency of the magnetic thin film surface roughness in a spin tunnel magnetoresistive effect element according to the present invention on the partial pressure of the gas introduced at the time of film formation.

The results presented above were the same even in the case in which the lamination sequence was reversed. FIG. 9 shows the dependency of the magnetic thin film surface roughness on the partial pressure of the gas introduced at the time of film formation. The vacuum pressure within the apparatus is first brought to within $10^{-6}$ and $10^{-10}$ Torr, and then the film is formed with oxygen, nitrogen, or hydrogen gas introduced therewithin.

It can be seen that it is possible to control the surface height unevenness of the film using the partial pressure of the introduced gas. In particular, it can be seen that by setting the partial pressure of the introduced gas to the range from $10^{-6}$ to $10^{-9}$ Torr, it is possible to control the average surface roughness to within 5 Angstroms.

It can be seen that it is further preferable that the vacuum be set in the range from $10^{-7}$ to $10^{-8}$ Torr, at which it is possible to achieve further control of the surface unevenness. If the partial pressure is beyond this range, there is a prominent deterioration of the crystallization of the spin tunnel magnetoresistive effect film, and a tendency for the surface roughness to increase. In this range, possibly because of an increase in the impurities within the film, attributed to the introduction of the gas, there is a decrease in the magnetoresistive change ratio.

The average surface roughness shown in the drawing indicates the average surface roughness of an anti-ferromagnetic thin film (PtMn) having a makeup that was achieved by successive lamination, onto a substrate made up of Sub (substrate 10)/CoZrTa (1 μm) (lower electrode layer 9)/Ta (100 Å) (underlayer 1), by controlling the introduced gas partial pressure, of PtMn (200) (anti-ferromagnetic thin film 2)/CoFe (20) (third magnetic thin film 3A)/Ru (6) (non-magnetic thin film 3B)/CoFe (20) (fourth magnetic thin film 3C)/NiFe (10) (first magnetic thin film 4).

The drawing shows average surface roughness of the PtMn, and the average surface roughness of the first, third, and fourth magnetic thin films formed thereover is substantially the same.

Figure 10:
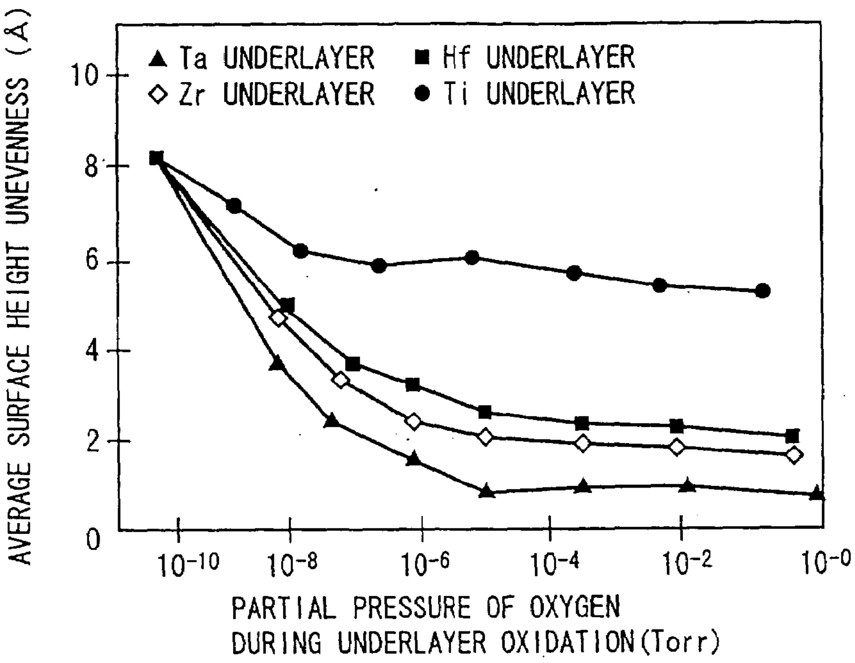
FIG. 10 is a graph showing the dependency of the magnetic thin film surface roughness in a spin tunnel magnetoresistive effect element according to the present invention on the partial pressure of the oxygen introduced at the time of oxidizing the underlayer.

FIG. 10 shows the dependency of the magnetic thin film surface roughness of the magnetic thin film on the partial pressure of the oxygen introduced at the time of oxidizing the lower layer.

In this case, the makeup was Sub/CoZrTa (1 μm)/Ta, Zr, Hf, Ti) (100 Å)/PtMn (200)/CoFe (20)/Ru (6)/CoFe (20)/NiFe (10)/Al (6)-Ox/CoFe (10)/NiFe (50)/Ta (50).

It can be seen that by oxidizing a Ta, Zr, Hf underlayer of the present invention under appropriate conditions ($10^{-6}$ Torr or greater, and preferably $10^{-10}$ Torr or greater), there is a prominent improvement in the flatness of the magnetic thin film.

It can further be seen that the flatness is improved even in the case in which Ti is used in the underlayer, although not as prominent an improvement as when using Ta, Zr, and Hf.

Figure 11:
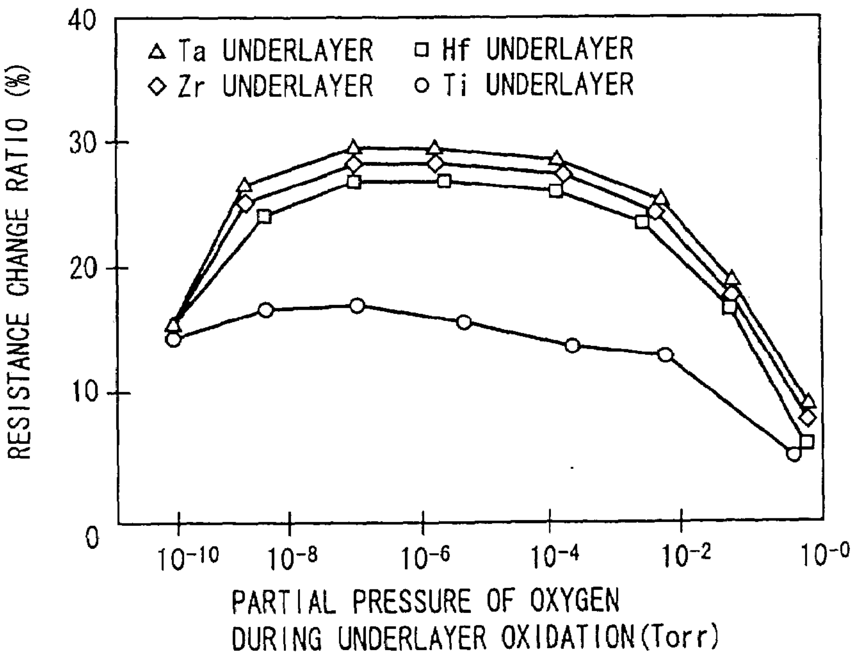
FIG. 11 is a graph showing the dependency of the resistance change rate of a spin tunnel magnetoresistive effect element according to the present invention on the partial pressure of the oxygen introduced at the time of oxidizing the underlayer.

FIG. 11 is a drawing showing the dependency of the resistance change rate on the material of the underlayer as it relates to the partial pressure of the oxygen introduced at the time of oxidizing the underlayer. The film makeup is the same as noted with regard to FIG. 10. The resistance change ratio rises with an improvement in the surface roughness in the above-noted magnetic thin film, although it decreases if the oxygen partial pressure is higher than $10^{-2}$ Torr.

This is because the effect of the surface oxidation is to increase the added resistance of the element, and because of a deterioration in the magnetic thin film, resulting in a decrease in the spin polarization of the magnetic thin film. The results were similar even if the lamination sequence was reversed.

Figure 12:
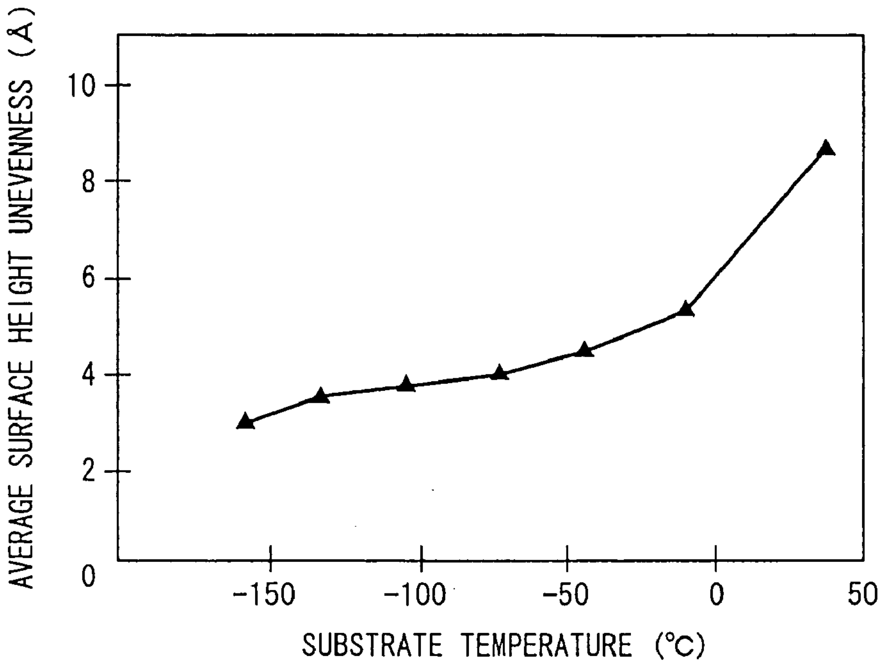
FIG. 12 is a graph showing the dependency the surface roughness in a magnetic thin film of a spin tunnel magnetoresistive effect element according to the present invention on the substrate temperature.

FIG. 12 shows the dependency of the surface roughness in a magnetic thin film on the substrate temperature during film formation.

This drawing shows the results for a film makeup of Sub/CoZrTa (1 μm)/(Ta, Zr, Hf, Ti) (100 Å)/PtMn (200)/CoFe (20)/Ru (6)/CoFe (20)/NiFe (10)/Al (3–20)/-Ox/CoFe (10)/NiFe (50)/Ta (50).

The surface height unevenness shown in the drawing is that of the PtMn surface. The average surface height unevenness is smoothed by forming the PtMn film at a reduced substrate temperature, and there is a particular improvement in the flatness to better than 5 Angstroms at a temperature of below 0° C.

The average surface height unevenness influences the average surface height unevenness of the CoFe film laminated thereover, and further of the Ru film, the CoFe thereover, and the NiFe thereover, thereby influencing the surface height unevenness of the tunnel barrier layer. For this reason, in order to control the surface height unevenness of the film, it is preferable when forming the CoFe/Ru/CoFe/NiFe films disposed beneath the tunnel barrier layer 5 that the temperature of the substrate be keep below 0° C.

The result of keeping the substrate temperature below 0° C. in this manner even when forming the CoFe film over the PtMn was that the average surface height unevenness of the CoFe surface substantially the same as the average surface height unevenness of the PtMn shown in FIG. 12.

Additionally, a similar result was obtained in the case of reversing the lamination sequence, that is, in the case of a film makeup of Sub/CoZrTa (1 μm)/(Ta, Zr, Hf, Ti) (100 Å)/NiFe (50)/CoFe (10)/Al (3–20)-Ox/NiFe (10)/CoFe (20)/Ru (6)/CoFe (20)/PtMn (200)/Ta (50).

Figure 13:
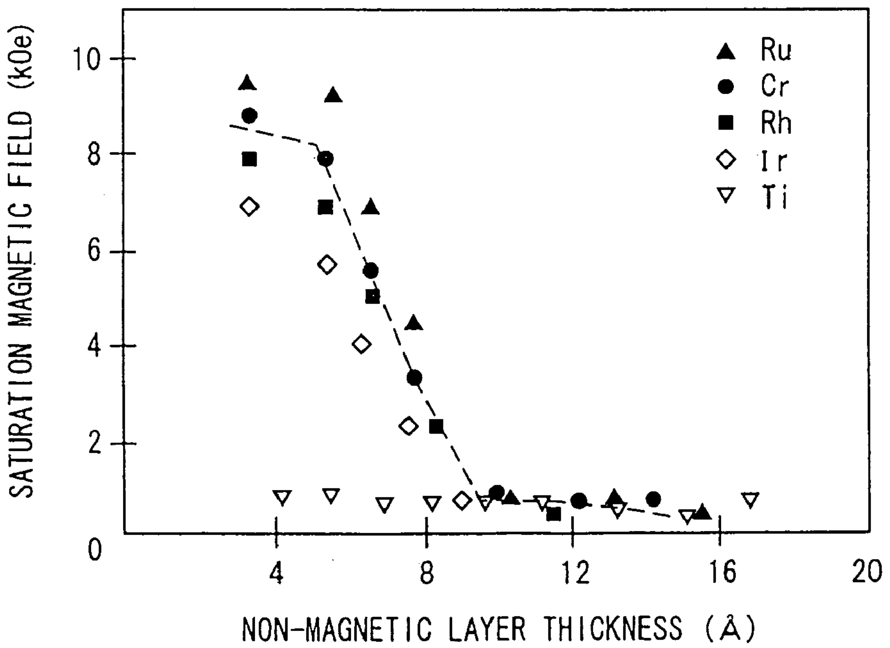
FIG. 13 is a graph showing the dependency of the saturation magnetic field in a spin tunnel magnetoresistive effect film according to the present invention on the non-magnetic film thickness.

FIG. 13 shows the dependency of the saturation magnetic field in the anti-ferromagnetically coupled three-layer film on the non-magnetic film thickness.

The drawing shows the results for a film makeup of Sub/CoZrTa (1 μm)/(Ta, Zr, Hf) (100 Å)/PtMn (200)/CoFe (20)/Ru, Cr, Rh, Ir, Ti) (4–16)/CoFe (20)/NiFe (10)/Al (3–20)-Ox/CoFe (10)/NiFe (50)/Ta (50).

The saturation magnetic field shows a prominent increase when the non-magnetic thin film is reduced to smaller than 10 Angstroms. The saturation magnetic field exhibits saturation at from 5 to 6 Angstroms, and below 4 Angstroms there is a prominent influence from direct contact between the magnetic thin films (pinholes).

By using Ru, Cr, Rh, and Ir as the non-magnetic layer, a large saturation magnetic field (that is, an anti-ferromagnetically coupled magnetic field) is obtained, and with Ti or other metals it is not possible to achieve sufficient anti-ferromagnetic coupling characteristics. These results are the same even in case the lamination sequence is reversed.

Figure 14:
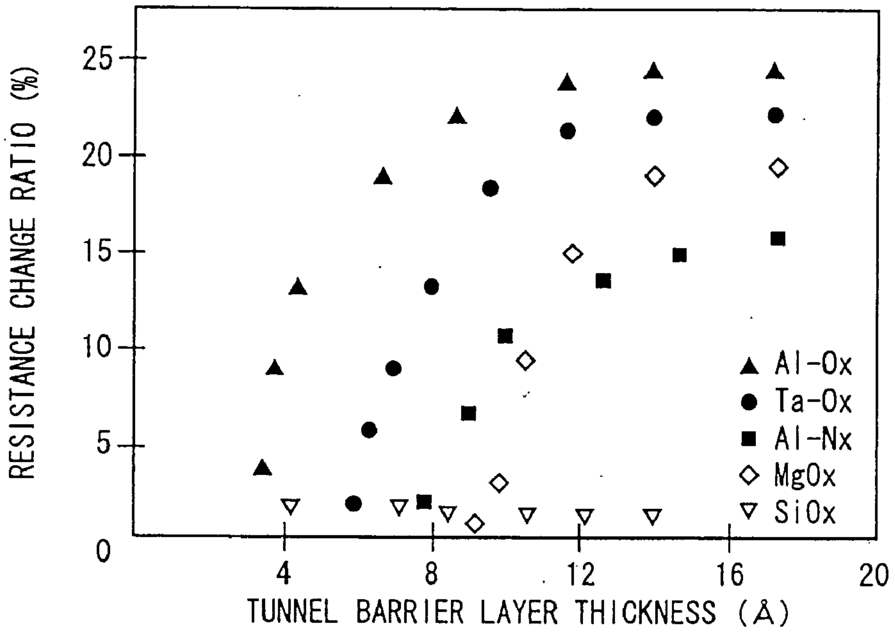
FIG. 14 is a drawing showing the dependency of the resistance change ratio of a spin tunnel magnetoresistive effect film according to the present invention on the tunnel barrier layer thickness for various barrier layer materials

FIG. 14 shows the dependency of the resistance change ratio of a spin tunnel magnetoresistive effect film according to the present invention on the tunnel barrier layer thickness for various barrier layer materials.

This drawing shows the results for a film makeup of Sub/CoZrTa (1 μm)/(Ta, Zr, Hf) (100 Å)/PtMn (200)/CoFe (20)/Ru, Cr, Rh, Ir) (4–16)/CoFe (20)/NiFe (10)/(Al (3–20)-Ox, Ta (3–20)-Ox, Al (3–20)-Nx, Mg (3–20)-Ox, Si (3–20)-Ox)/CoFe (10)/NiFe (50)/Ta (50).

A value of 15% was obtained as a resistance change ratio for any of the materials, and in the very thin film region the influence of uniformity in the barrier layer or barrier height is observed, a large difference in resistance change ratio exiting between the materials.

By using an Al oxide layer, a high resistance change ratio is achieved even in the region of 4 Angstroms. Under these conditions, the junction resistance exhibits a monotonic decrease along with a decrease in the barrier layer thickness. It was further verified that there was almost no change in resistance in a SiOx barrier fabricated for the purpose comparison with the present invention.

Figure 15:
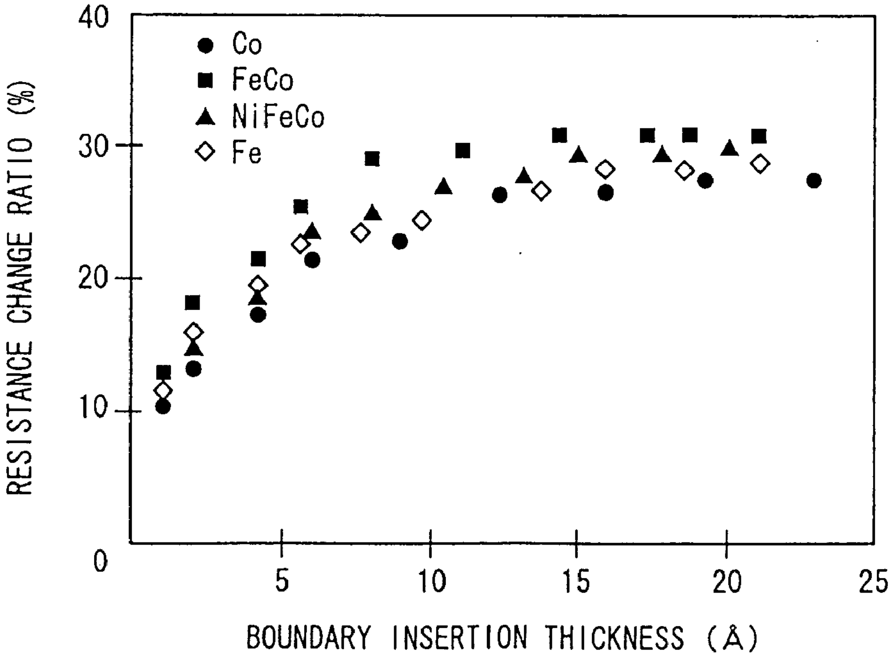
FIG. 15 is a drawing showing the dependency of the resistance change ratio of a spin tunnel magnetoresistive effect film according to the present invention on the boundary magnetic layer insertion thickness.

FIG. 15 shows the dependency of the resistance change ratio insertion thickness when a high-polarization material is inserted into the barrier layer boundary.

The drawing shows the results with a film makeup of Sub/CoZrTa (1 μm)/Ta (100 Å)/PtMn (200)/CoFe (20)/Ru (6)/CoFe (20)/(Co, FeCo, NiFeCo, Fe) (1–25)/Al (3–20)-Ox/CoFe (10)/NiFe (50)/Ta (50).

The resistance change ratio is increased by the insertion of a ferromagnetic layer having high polarization, and this effect was verified even in the region from 1 to 3 Angstroms.

Figure 16:
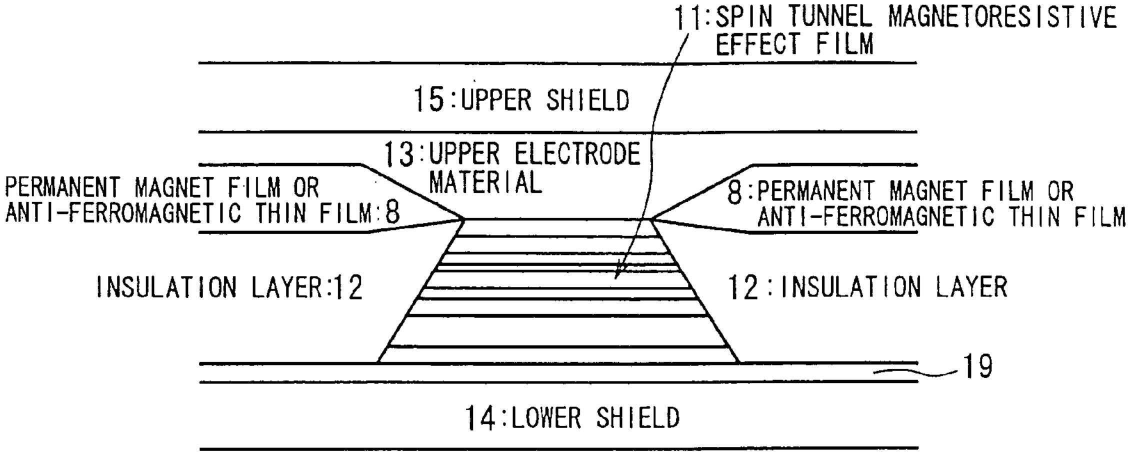
FIG. 16 is a partial cross-sectional view showing a shielded type spin tunnel magnetoresistive effect element according to the present invention.

FIG. 16 shows a partial cross-sectional view of a shielded type spin tunnel magnetoresistive effect element according to the present invention. The magnetoresistive effect element 1 is formed by laminating an appropriate number of layers onto the upper and lower magnetic shields 14 and 15, with intervening upper and lower electrode materials 13 and 19 therebetween. The spin tunnel magnetoresistive effect film 11 is covered on the side by the insulation layer 12, and has neighboring it a permanent magnet film 8, thereby forming a single magnetic domain in the magnetic layer which detects a magnetic field.

Figure 17:
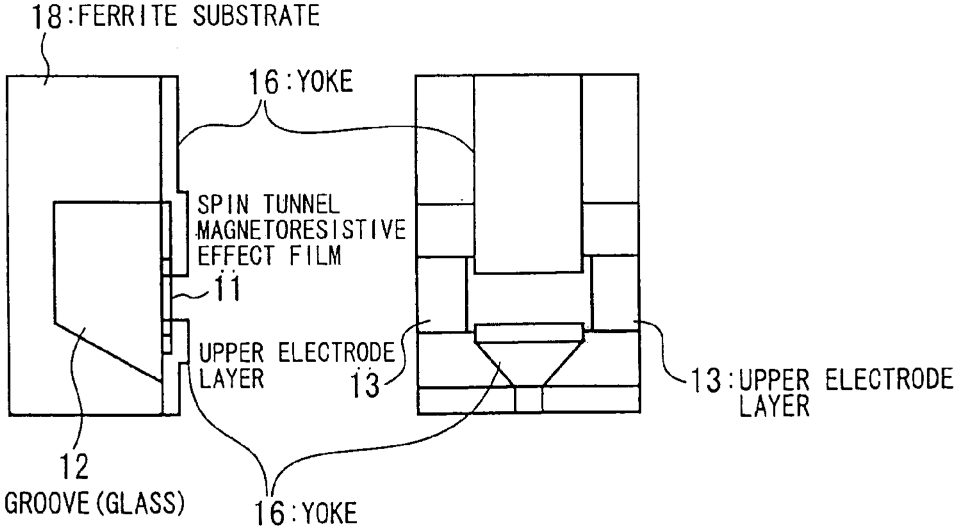
FIG. 17 is a partial cross-sectional view and front elevation of a yoke-type spin tunnel magnetoresistive effect element according to the present invention.

FIG. 17 is a partial cross-sectional view and front elevation of a yoke-type spin tunnel magnetoresistive effect element according to the present invention. The spin tunnel magnetoresistive effect element is laminated onto a ferrite substrate and patterned. Similar to the shielded type, a permanent magnet film is in neighboring contact with the spin tunnel magnetoresistive effect film, thereby forming a single magnetic domain in the magnetic layer that detects a magnetic field, the external magnetic field being guided by the yoke.

Figure 18A:
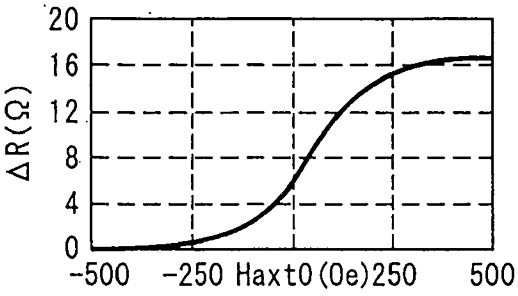
FIGS. 18(*a*) and (*b*) are MR curve graphs of a spin tunnel magnetoresistive effect element according to the present invention.
Figure 18B:
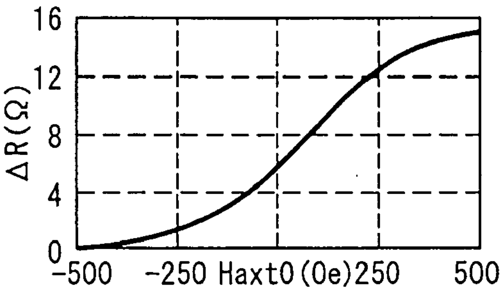

FIG. 18 (is) shows the MR curves of an element in which a spin tunnel magnetoresistive effect film height is 0.4 μm, and the element width is 0.4 μm, and in which a neighboring CoCrPt permanent magnet film is disposed as a magnetic domain stabilizing film.

From these curves, it can be seen that by virtue of the permanent magnet film magnetic domain stability is achieved, and such non-linear output as Barkhausen jump is avoided, in addition to achieving an output that is 6 to 10 times the size of a magnetoresistive effect film of the past.

Figure 19:
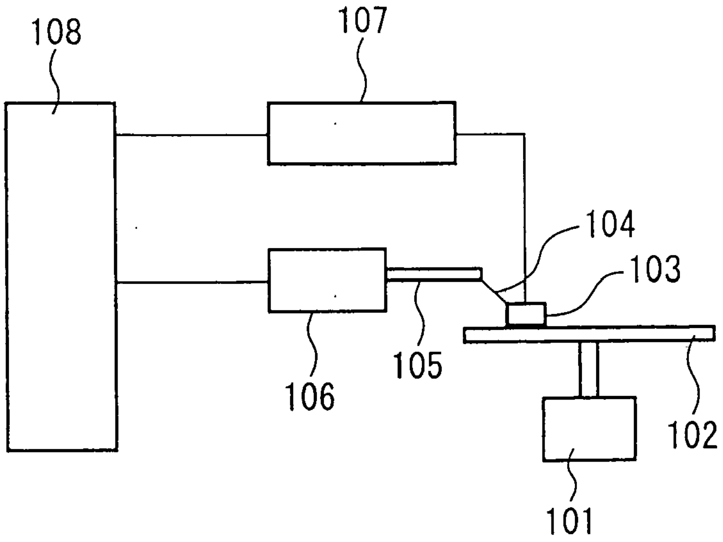
FIG. 19 is a simplified drawing showing the configuration of a magnetic recording and playback apparatus using a spin tunnel magnetoresistive effect film according to the present invention.

FIG. 19 shows a magnetic recording and reading apparatus using a spin tunnel magnetoresistive effect film according to the present invention in a recording and playback head.

The magnetic recording and reading apparatus shown in FIG. 19 is made up of a drive motor 101, which rotates a magnetic recording medium 102, a suspension 104 and arm 105, to which a recording and reading head 103 is mounted, and an actuator 106, which performs positioning control of the head 103.

The recording and reading head 103 is made up of a magnetoresistive effect element formed by a spin tunnel magnetoresistive effect film as shown in FIG. 1(*a*) through FIG. 2(*b*), this film functioning to play back information recorded on the magnetic recording medium 102, and a recording unit, which serves to perform the function of recording onto the magnetic recording medium 102.

The recording and reading operations are performed by a signal from a recording and playback channel 107 to the recording and playback head 103. The recording and reading channel 107, the recording and reading head 103, the reading head 103 positioning actuator 106, and the drive motor 102, which rotates the magnetic recording medium 102, are controlled by a control unit 108.

In this magnetic recording and reading apparatus, because magnetic reading is performed by a magnetoresistive effect element (magnetoresistive effect sensor) made of a spin tunnel magnetoresistive effect film according to the present invention, it is possible to achieve a magnetic recording and reading apparatus capable of good reading at a high areal recording density of 100 gigabits/inch$^2$.

By adopting the technical constitution described in detail above, the present invention achieves superior thermal stability, and exhibits a resistance that is sufficiently low for use in a magnetic head, making it possible to achieve a spin tunnel magnetoresistive effect film and a spin tunnel magnetoresistive effect element with a high magnetic field sensitivity, which is linear in the region of zero magnetic field, and further possible to achieve a magnetic device using this film and element.

What is claimed is:

1. A method for manufacturing a spin tunnel magnetoresistive effect film, comprising:

providing at least a structure of a lower electrode layer, an anti-ferromagnetic thin film, a first magnetic thin film, a tunnel barrier layer, a second magnetic thin film, and an upper electrode layer, each being successively laminated, wherein an exchange coupling magnetic field of said first magnetic thin film in accordance with said anti-ferromagnetic thin film is Hr, a coercivity of said second magnetic thin film is Hc2, and said Hr and Hc2 satisfy the relationship of Hc2<Hr; and providing an underlayer disposed between said lower electrode layer and said anti-ferromagnetic thin film and made of Ta, Zr, Hf, or an alloy thereof, the average surface height unevenness of said anti-ferromagnetic thin film on said underlayer being in the range from 0.1 to 5 Angstroms, wherein controlling average surface roughness forms said tunnel barrier layer by introducing gas having nitrogen, hydrogen or a gas mixture thereof at a pressure in a range from $10^{-6}$ Torr to $10^{-9}$ Torr into a film growing chamber.

2. A method for manufacturing a spin tunnel magnetoresistive effect film, comprising:

providing at least a structure of a lower electrode layer, an anti-ferromagnetic thin film, a first magnetic thin film, a tunnel barrier layer, a second magnetic thin film, and an upper electrode layer, each being successively laminated, wherein an exchange coupling magnetic field of said first magnetic thin film in accordance with said anti-ferromagnetic thin film is Hr, a coercivity of said second magnetic thin film is Hc2, and said Hr and Hc2 satisfy the relationship of Hc2<Hr; and providing an underlayer disposed between said lower electrode layer and said anti-ferromagnetic thin film and made of Ta, Zr, Hf, or an alloy thereof, the average surface height unevenness of said and-ferromagnetic thin film on said underlayer being in the range from 0.1 to 5 Angstroms, wherein controlling average surface roughness forms said tunnel barrier layer by introducing gas having nitrogen, hydrogen or a gas mixture thereof at a pressure in the range from $10^{-7}$ Torr to $10^{-8}$ Torr into a film growing chamber.

3. A method for manufacturing a spin tunnel magnetoresistive effect film, comprising:

providing at least a structure of a lower electrode layer, an anti-ferromagnetic thin film, a first magnetic thin film, a tunnel barrier layer, a second magnetic thin film, and an upper electrode layer, each being successively laminated, wherein an exchange coupling magnetic field of said first magnetic thin film in accordance with said anti-ferromagnetic thin film is Hr, a coercivity of said second magnetic thin film is Hc2, and said Hr and Hc2 satisfy the relationship of Hc2<Hr; and providing an underlayer disposed between said lower electrode layer and said anti-ferromagnetic thin film and made of Ta, Zr, Hf, or an alloy thereof, the average surface height unevenness of said anti-ferromagnetic thin film on said underlayer being in the range from 0.1 to 5 Angstroms, wherein controlling average surface roughness causes oxidation of a surface of the underlayer made of Ta, Zr, Hf or an alloy thereof.

4. A method for manufacturing a spin tunnel magnetoresistive effect film, comprising:

providing at least a structure of a lower electrode layer, an anti-ferromagnetic thin film/first magnetic thin film, a tunnel barrier layer, a second magnetic thin film, and an upper electrode layer, each being successively laminated, wherein an exchange coupling magnetic field of said first magnetic thin film in accordance with said anti-ferromagnetic thin film is Hr, a coercivity of said second magnetic thin film is Hc2, and said Hr and Hc2 satisfy the relationship of Hc2<Hr; and providing an underlayer disposed between said lower electrode layer and said anti-ferromagnetic thin film and made of Ta, Zr, Hf, or an alloy thereof, the average surface height unevenness of said anti-ferromagnetic thin film on said underlayer being in the range from 0.1 to 5 Angstroms, wherein controlling average surface roughness cools a substrate to a temperature of 0° C. or lower during film growth.

5. A method for manufacturing a spin tunnel magnetoresistive effect film according to claim 4, wherein said tunnel barrier layer oxidation or nitridation is performed at a substrate temperature in a range from room temperature to 250° C.

* * * * *